US012686295B2

(12) United States Patent
Numata et al.

(10) Patent No.: US 12,686,295 B2
(45) Date of Patent: Jul. 21, 2026

(54) BATTERY PACK AND COMMUNICATION METHOD

(71) Applicant: DENSO CORPORATION, Kariya-city (JP)

(72) Inventors: Tatsuhiro Numata, Kariya-city (JP); Shingo Kawahara, Kariya-city (JP)

(73) Assignee: DENSO CORPORATION, Kariya (JP)

( * ) Notice: Subject to any disclaimer, the term of this patent is extended or adjusted under 35 U.S.C. 154(b) by 387 days.

(21) Appl. No.: 18/215,456

(22) Filed: Jun. 28, 2023

(65) Prior Publication Data

US 2023/0339359 A1 Oct. 26, 2023

Related U.S. Application Data

(63) Continuation of application No. PCT/JP2021/047887, filed on Dec. 23, 2021.

(30) Foreign Application Priority Data

Dec. 28, 2020 (JP) ................................. 2020-219303

(51) Int. Cl.
    B60L 58/10 (2019.01)
    B60L 50/60 (2019.01)
    (Continued)

(52) U.S. Cl.
    CPC ............... B60L 58/10 (2019.02); B60L 50/66 (2019.02); G01R 31/371 (2019.01);
    (Continued)

(58) Field of Classification Search
    CPC ........ B60L 58/10; B60L 50/66; B60L 3/0046; B60L 3/0084; B60L 3/04; B60L 3/12;
    (Continued)

(56) References Cited

U.S. PATENT DOCUMENTS

2020/0076013 A1*  3/2020  Sato ....................... H01M 10/48
2020/0412146 A1* 12/2020  Takechi .................. H02J 7/005
2021/0278468 A1*  9/2021  Kojima ............. H02J 13/00002

FOREIGN PATENT DOCUMENTS

JP        H05-236570 A        9/1993
JP        2010142083 A   *    6/2010
                (Continued)

OTHER PUBLICATIONS

JP-2010142083-A_translated (Year: 2010).*
                (Continued)

*Primary Examiner* — Catherine T. Rastovski
*Assistant Examiner* — Michael J Singletary
(74) *Attorney, Agent, or Firm* — Oliff PLC

(57) ABSTRACT

A battery pack includes a battery, a battery monitoring apparatus, a battery control apparatus, a housing, a transmissive portion, and a protection mechanism. The battery monitoring apparatus that monitors a state of the battery; a battery control apparatus that performs wireless communication with the battery monitoring apparatus, acquires battery information that is a monitoring result from the battery monitoring apparatus, and performs various types of control. The housing houses the battery, the battery monitoring apparatus, and the battery control apparatus. The transmissive portion is provided in at least a portion of the housing and allows transmission of radio waves. The protection mechanism is provided in the battery monitoring apparatus and the battery control apparatus and protects the battery information when wireless communication is performed.

39 Claims, 22 Drawing Sheets

10

(51) Int. Cl.

| | | |
|---|---|---|
| *G01R 31/371* | (2019.01) | |
| *G01R 31/396* | (2019.01) | |
| *G08C 17/02* | (2006.01) | |
| *H02J 7/40* | (2026.01) | |

(52) U.S. Cl.
CPC .......... *G01R 31/396* (2019.01); *G08C 17/02* (2013.01); *H02J 7/40* (2026.01)

(58) Field of Classification Search
CPC ......... B60L 2240/545; B60L 2240/547; B60L 50/64; G01R 31/371; G01R 31/396; G08C 17/02; H02J 7/00032; H02J 7/00; H01M 10/42; H01M 10/48; H01M 50/20; H04L 1/00; Y02E 60/10; Y02T 90/16

See application file for complete search history.

(56) References Cited

FOREIGN PATENT DOCUMENTS

| | | | | |
|---|---|---|---|---|
| JP | 2014207053 | A | * | 10/2014 |
| JP | 2016012954 | A | * | 1/2016 |
| JP | 2019-125834 | A | | 7/2019 |
| JP | 2019221050 | A | * | 12/2019 |
| JP | 2020-188546 | A | | 11/2020 |
| WO | 2018/159009 | A1 | | 9/2018 |

OTHER PUBLICATIONS

JP-2019221050-A_translated (Year: 2019).*
JP-2014207053-A_translated (Year: 2014).*
JP-2016012954-A_translated (Year: 2016).*

* cited by examiner

ORDER OF RECEPTION

| COMMAND 1 | SBM1 |
|-----------|------|
|           |      |
| COMMAND 1 | SBM3 |

COMMUNICATION SCHEDULE

| COMMAND 1 | SBM1 |
|-----------|------|
| COMMAND 1 | SBM2 |
| COMMAND 1 | SBM3 |
| COMMAND 1 | SBM4 |
| .         | .    |
| .         | .    |
| .         | .    |

(b)

ORDER OF RECEPTION

| COMMAND 1 | SBM2 |
|-----------|------|
| COMMAND 1 | SBM1 |
|           |      |

COMMUNICATION SCHEDULE

| COMMAND 1 | SBM1 |
|-----------|------|
| COMMAND 1 | SBM2 |
| COMMAND 1 | SBM3 |
| COMMAND 1 | SBM4 |
| .         | .    |
| .         | .    |
| .         | .    |

(c)

ORDER OF RECEPTION

| COMMAND 1 | SBM1 |
|-----------|------|
| COMMAND 1 | SBM1 |
|           |      |

COMMUNICATION SCHEDULE

| COMMAND 1 | SBM1 |
|-----------|------|
| COMMAND 1 | SBM2 |
| COMMAND 1 | SBM3 |
| COMMAND 1 | SBM4 |
| .         | .    |
| .         | .    |
| .         | .    |

FIG.14

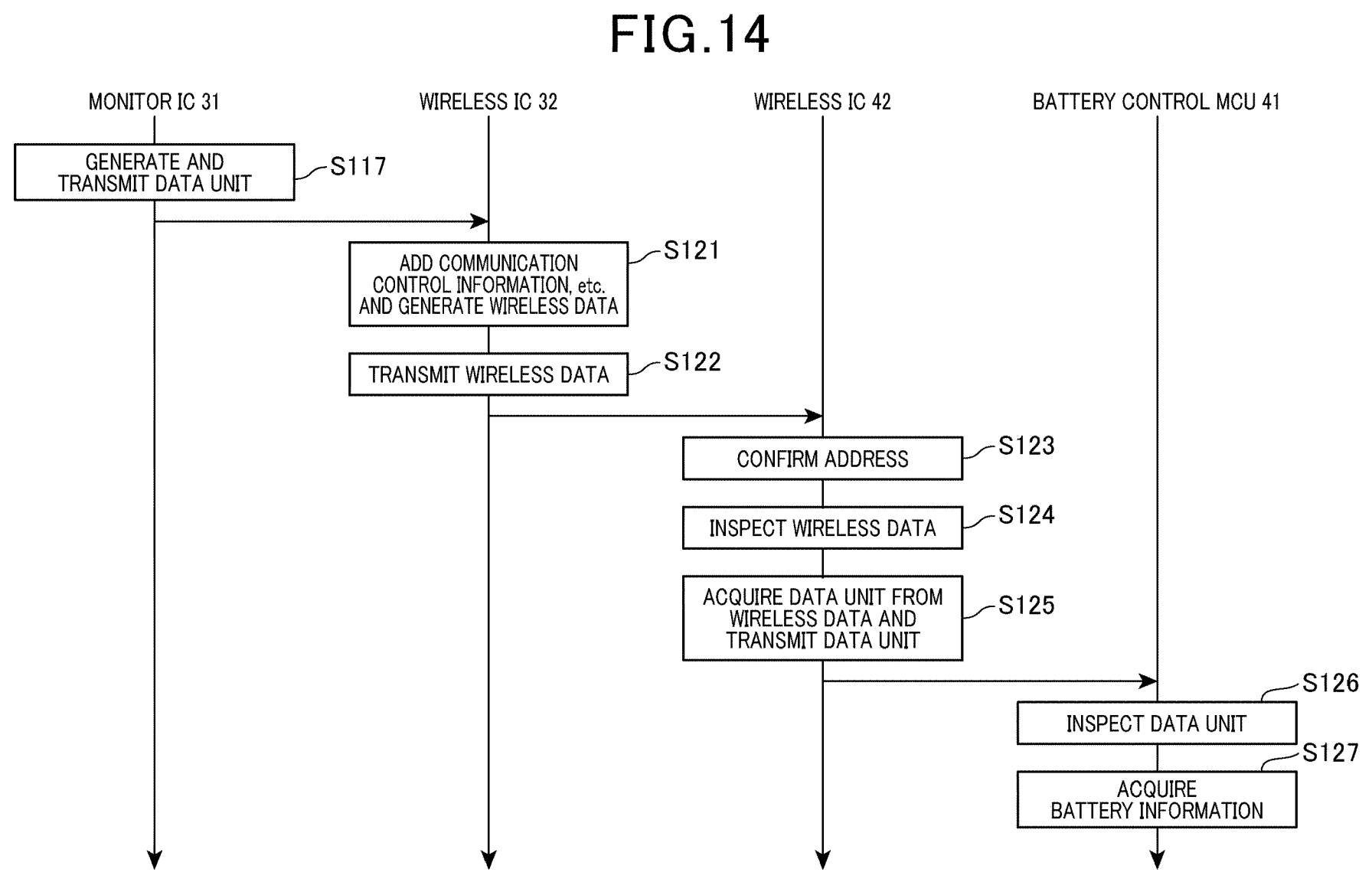

MONITOR IC 31

GENERATE AND TRANSMIT DATA UNIT — S117

WIRELESS IC 32

ADD COMMUNICATION CONTROL INFORMATION, etc. AND GENERATE WIRELESS DATA — S121

TRANSMIT WIRELESS DATA — S122

WIRELESS IC 42

CONFIRM ADDRESS — S123

INSPECT WIRELESS DATA — S124

ACQUIRE DATA UNIT FROM WIRELESS DATA AND TRANSMIT DATA UNIT — S125

BATTERY CONTROL MCU 41

INSPECT DATA UNIT — S126

ACQUIRE BATTERY INFORMATION — S127

BATTERY PACK AND COMMUNICATION METHOD

CROSS-REFERENCE TO RELATED APPLICATION

The present application is a continuation application of International Application No. PCT/JP2021/047887, filed on Dec. 23, 2021, which claims priority to Japanese Patent Application No. 2020-219303, filed on Dec. 28, 2020. The contents of these applications are incorporated herein by reference in their entirety.

BACKGROUND

The present disclosure relates to a battery pack and a communication method. It is known that, when wireless communication is performed, radio waves are blocked when an antenna is covered with metal or the like.

SUMMARY

One aspect of the present disclosure provides a battery pack that includes a battery, a battery monitoring apparatus, a battery control apparatus, a housing, a transmissive portion, and a protection mechanism. The battery monitoring apparatus that monitors a state of the battery; a battery control apparatus that performs wireless communication with the battery monitoring apparatus, acquires battery information that is a monitoring result from the battery monitoring apparatus, and performs various types of control. The housing houses the battery, the battery monitoring apparatus, and the battery control apparatus. The transmissive portion is provided in at least a portion of the housing and allows transmission of radio waves. The protection mechanism is provided in the battery monitoring apparatus and the battery control apparatus and protects the battery information when wireless communication is performed.

BRIEF DESCRIPTION OF THE DRAWINGS

In the accompanying drawings:

FIG. 6 is a perspective view of a housing;

FIG. 10 is a diagram illustrating examples of errors in an order of reception;

FIG. 14 is a sequence diagram illustrating the flow of the wireless communication method;

DESCRIPTION OF THE EMBODIMENTS

Figure 1:
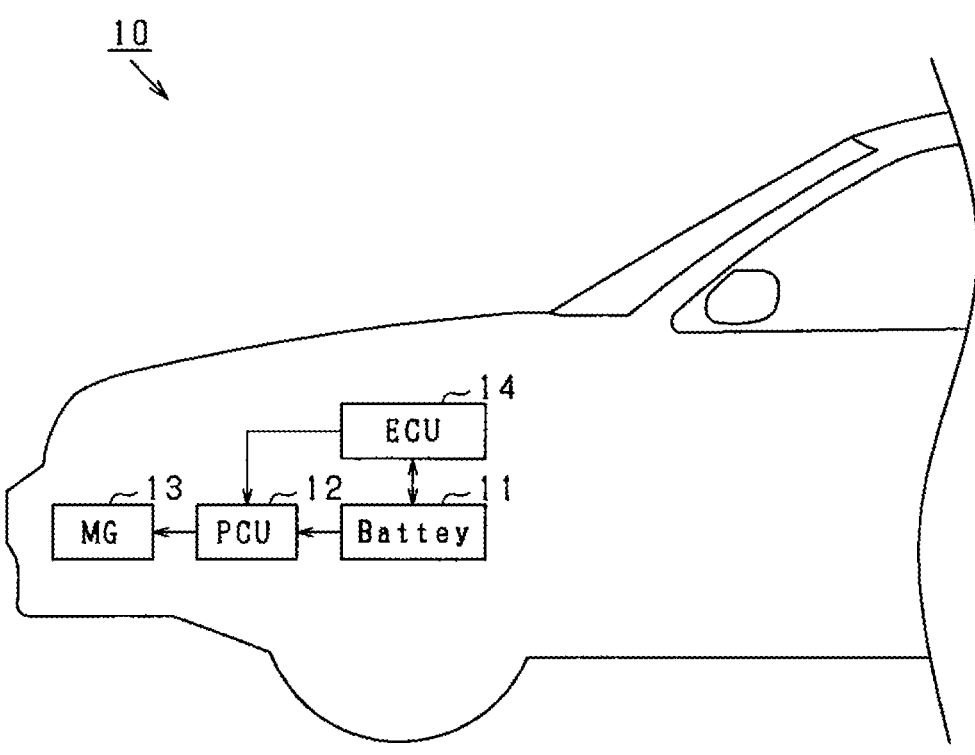
FIG. 1 is a diagram illustrating the configuration of a vehicle 10.

Conventionally, it is known that, when wireless communication is performed, radio waves are blocked when an antenna is covered with metal or the like (JP 2019-125834 A). Meanwhile, regarding battery packs, how measures for blocking external radio waves in a battery pack are implemented when wireless communication is actualized has not been examined.

It is thus desired to provide a battery pack and a communication method that enable wireless communication to be appropriately performed without being affected by external radio waves.

A first exemplary embodiment of the present disclosure provides a battery pack that includes: a battery; a battery monitoring apparatus that monitors a state of the battery; a battery control apparatus that performs wireless communication with the battery monitoring apparatus, acquires battery information that is a monitoring result from the battery monitoring apparatus, and performs various types of control; and a housing that houses the battery, the battery monitoring apparatus, and the battery control apparatus. The battery pack includes: a transmissive portion that is provided in at least a portion of the housing and allows transmission of radio waves; and a protection mechanism that is provided in the battery monitoring apparatus and the battery control apparatus and protects the battery information when wireless communication is performed.

The transmissive portion that allows transmission of radio waves is provided in a portion of the housing. However, because the protection mechanism that protects the battery information when wireless communication is performed is provided in the battery monitoring apparatus and the battery control apparatus that are housed in the housing, wireless communication can be appropriately performed without being affected by radio waves from outside the housing.

A second exemplary embodiment of the present disclosure provides a communication method that is performed by a battery control apparatus of a battery pack. The battery pack includes: a battery; a battery monitoring apparatus that monitors a state of the battery; the battery control apparatus that performs wireless communication with the battery monitoring apparatus, acquires battery information that is a monitoring result from the battery monitoring apparatus, and performs various types of control; and a housing that houses the battery, the battery monitoring apparatus, and the battery control apparatus. The communication method includes: providing a transmissive portion in at least a portion of the housing, the transmissive portion allowing transmission of radio waves; adding, to the battery information that is wirelessly transmitted when wireless transmission is performed, inspection data for inspecting the battery information by the battery monitoring apparatus; and inspecting, by the battery control apparatus, whether the battery information is correctly transmitted and received based on the inspection data that is added to the battery information, when the battery information is received from the battery monitoring apparatus.

The transmissive portion that allows transmission of radio waves is provided in a portion of the housing. However, the battery control apparatus, housed in the housing, inspects whether the battery information is correctly transmitted and received based on the inspection data added to the battery information when the battery information is received from the battery monitoring apparatus. Thus, wireless communication can be appropriately performed without being affected by radio waves from outside the housing.

The above-described exemplary embodiments of the present disclosure will be further clarified through the detailed description herebelow, with reference to the accompanying drawings.

An embodiment of a battery pack of the present disclosure will hereinafter be described in detail with reference to the drawings. Here, sections in the drawings that are identical or equivalent are given the same reference numbers, and descriptions thereof are not repeated. Hereafter, an embodiment in which a battery pack 11 is applied to a vehicle 10 is described. However, the battery pack 11 of the present disclosure can also be applied to uses other than a vehicle.

<Overall Configuration of the Vehicle 10>

FIG. 1 is a diagram that schematically shows a configuration of the vehicle 10. The vehicle 10 includes the battery pack 11 (denoted as "Battery" in FIG. 1), a power control unit (referred to, hereafter, as "PCU") 12, a motor 13 (denoted as "MG" in FIG. 1), and a vehicle electronic control unit (ECU) 14 (denoted as "ECU" in FIG. 1).

The battery pack 11 is mounted to the vehicle 10 as a drive power supply of the vehicle 10. In FIG. 1, the battery pack 11 is located in an engine compartment of the vehicle 10. However, the battery pack 11 may be located in another location, such as a trunk compartment, under a seat, or under a floor. The vehicle 10 is an electric automobile or a hybrid automobile that travels using electric power that is stored in the battery pack 11.

The battery pack 11 includes an assembled battery 20 that is configured to include numerous battery cells 22 (secondary cells). Specifically, a battery block 21 (also referred to as a battery stack or a battery module) is configured by a plurality of battery cells 22 that are connected in series and/or parallel. The assembled battery 20 is configured by a plurality of battery blocks 21 being connected in series. Each battery cell 22 is configured by a lithium-ion secondary battery, a nickel-hydrogen secondary battery, or the like. Here, the lithium-ion secondary battery is a secondary battery of which lithium is a charge carrier. In addition to a typical lithium-ion secondary battery that has a liquid electrolyte, the lithium-ion secondary battery may also include a so-called solid-state battery in which a solid electrolyte is used.

The battery pack 11 stores electric power for driving the motor 13 in the assembled battery 20 and is capable of supplying the electric power to the motor 13 through the PCU 12. In addition, the battery pack 11 is charged by receiving generated electric power of the motor 13 through the PCU 12 during regenerative power generation of the motor 13, such as during vehicle braking.

Furthermore, the battery pack 11 is provided with a monitoring unit that monitors the assembled battery 20, and a control unit that receives a monitoring result from the monitoring unit and performs a predetermined process. Configurations of the monitoring unit and the control unit will be described in detail with reference to FIG. 2 and subsequent drawings.

The PCU 12 performs bi-directional power conversion between the battery pack 11 and the motor 13 based on control signals from the vehicle ECU 14. For example, the PCU 12 may be configured to include an inverter that drives the motor 13, and a converter that steps up a direct-current voltage that is supplied to the inverter to be equal to or greater than an output voltage of the battery pack 11.

The motor 13 is an alternating-current rotating electric machine. For example, the motor 13 may be a three-phase, alternating-current synchronous motor in which a permanent magnet is embedded in a rotor. The motor 13 generates rotational drive force by being driven by the PCU 12. The drive force that is generated by the motor 13 is transmitted to a drive wheel. Meanwhile, during braking of the vehicle 10, the motor 13 operates as a power generator and performs regenerative power generation. Electric power that is generated by the motor 13 is supplied to the battery pack 11 through the PCU 12 and stored in the assembled battery 20 inside the battery pack 11.

The vehicle ECU 14 is configured to include a central processing unit (CPU), a read-only memory (ROM), a random-access memory (RAM), an input/output port for inputting and outputting various signals, and the like. The CPU loads and runs a program that is stored in the ROM in the RAM. A process that is performed by the vehicle ECU 14 is written in the program that is stored in the ROM. As an example of a main process of the vehicle ECU 14, the vehicle ECU 14 controls driving of the motor 13 and charging and discharging of the battery pack 11 by receiving information such as a voltage, a current, and a state of charge (SOC) of the assembled battery 20 from the battery pack 11, and controlling the PCU 12.

<Configuration of the Battery Pack 11>

Figure 2:
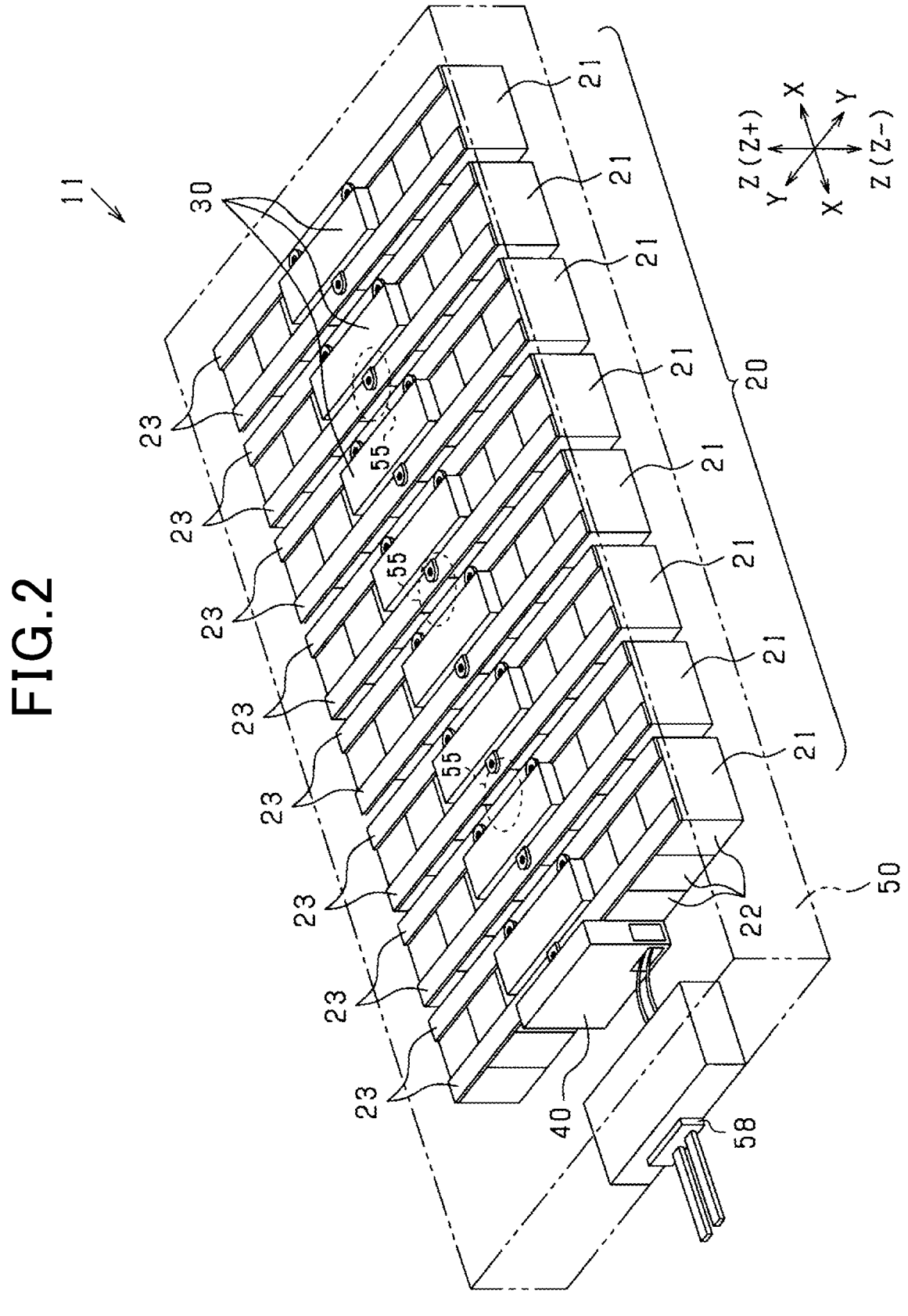
FIG. 2 is a perspective view of a battery pack, illustrating the interior thereof.

FIG. 2 is a perspective view that schematically shows an interior of the battery pack 11. The battery pack 11 includes the assembled battery 20, a plurality of battery monitoring apparatuses 30, a battery control apparatus 40, and a housing 50 that houses these components. Hereafter, as shown in FIG. 2, among surfaces of the housing 50 that is a rectangular parallelepiped, on an installation surface 51 (a bottom surface in FIG. 2) that is located in the vehicle 10, a longitudinal direction is referred to as an X direction and a transverse direction is referred to as a Y direction. In addition, a vertical direction that is perpendicular relative to the installation surface 51 is referred to as a Z direction. Here, according to the present embodiment, a transverse direction of the vehicle 10 corresponds to the X direction, a longitudinal direction of the vehicle 10 corresponds to the Y direction, and a vertical direction of the vehicle 10 corresponds to the Z direction. However, the battery pack 11 may be arranged in any manner relative to the vehicle 10.

<Configuration of the Assembled Battery 20>

The assembled battery 20 has the plurality of battery blocks 21 that are arranged in an array in the X direction. The assembled battery 20 is configured by these plurality of battery blocks 21 being connected in series. Each battery block 21 has the plurality of battery cells 22 that are arranged in an array in the Y direction. The battery block 21 is configured by these plurality of battery cells 22 being connected in series.

On a top surface of each battery block 21, linear bus bar units 23 are located on both ends in the X direction. The bus bar unit 23 electrically connects the battery cells 22. The bus bar unit 23 will be described with reference to FIG. 3.

Figure 3:
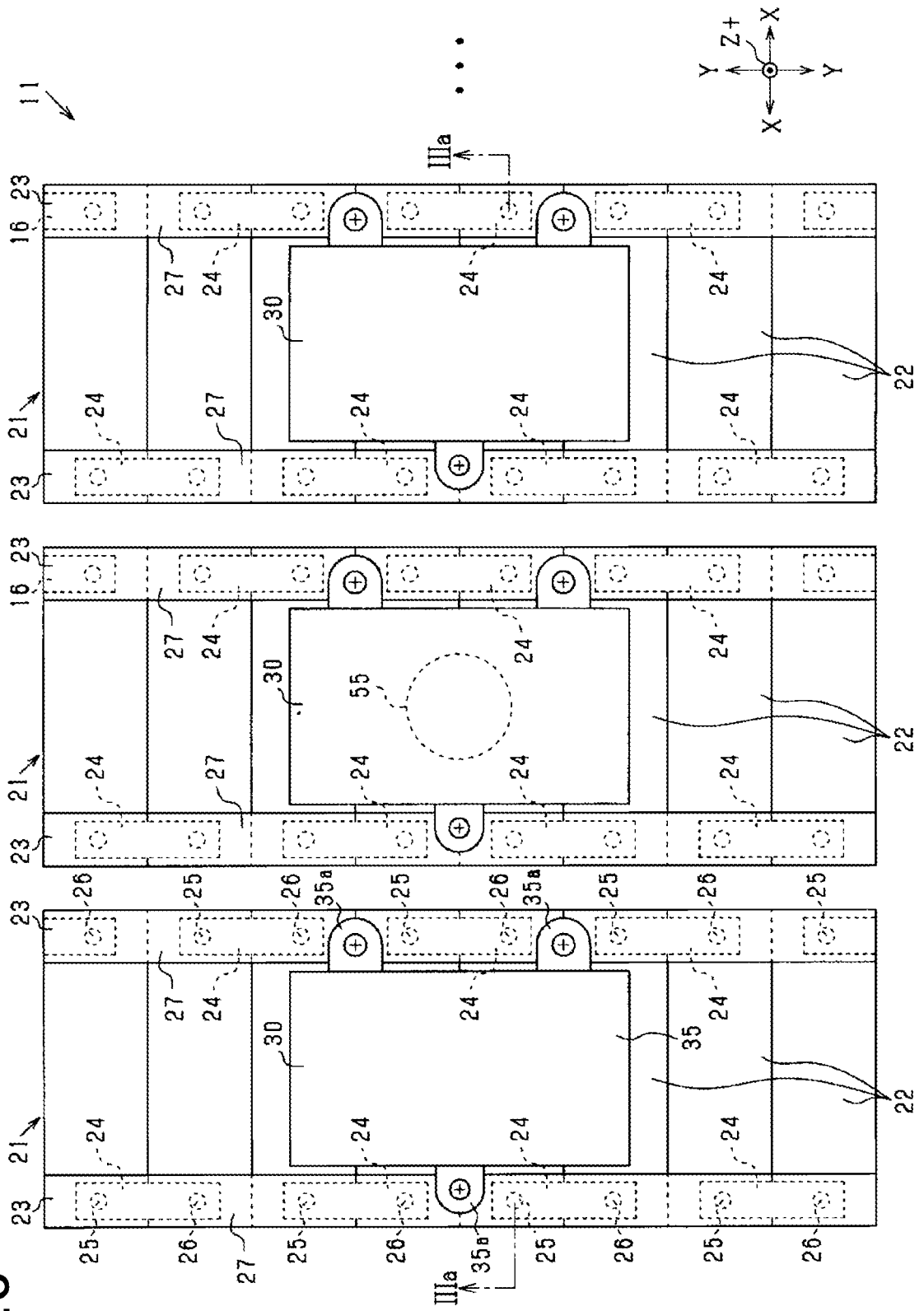
FIG. 3 is a top view of an assembled battery.

FIG. 3 is a plan view of the top surface of the battery blocks 21. Each battery cell 22 is formed into a flat shape. The battery cells 22 are stacked such that side surfaces overlap each other in the Y direction. In addition, the battery cell 22 has a positive electrode terminal 25 and a negative electrode terminal 26 that protrude in the Z direction (more specifically, a Z+ direction that indicates upward) on both ends in the X direction. The battery cells 22 are stacked such that the positive electrode terminals 25 and the negative electrode terminals 26 are alternately arranged in the Y direction.

Each bus bar unit 23 has a plurality of bus bars 24 that electrically connect the positive electrode terminal 25 and the negative electrode terminal 26, and a bus bar cover 27 that is made of a non-conductive body and covers the plurality of bus bars 24. The bus bar 24 electrically connects the positive electrode terminal 25 and the negative electrode terminal 26 of the battery cells 22 that are adjacent to each other in the Y direction. As a result, in each battery block 21, the plurality of battery cells 22 are electrically connected in series. Here, in each battery block 21, the positive electrode terminal 25 of the battery cell 22 that is arranged on one end side in the Y direction is connected to a predetermined positive electrode wire, and the negative electrode terminal 26 of the battery cell 22 that is arranged on the other end side is connected to a predetermined negative electrode wire.

The bus bar cover 27 is a resin or the like and is provided in a linear shape from end to end of the battery block 21 along the Y direction so as to cover the plurality of bus bars 24.

<Configuration of the Battery Monitoring Apparatus 30>

Figure 4:
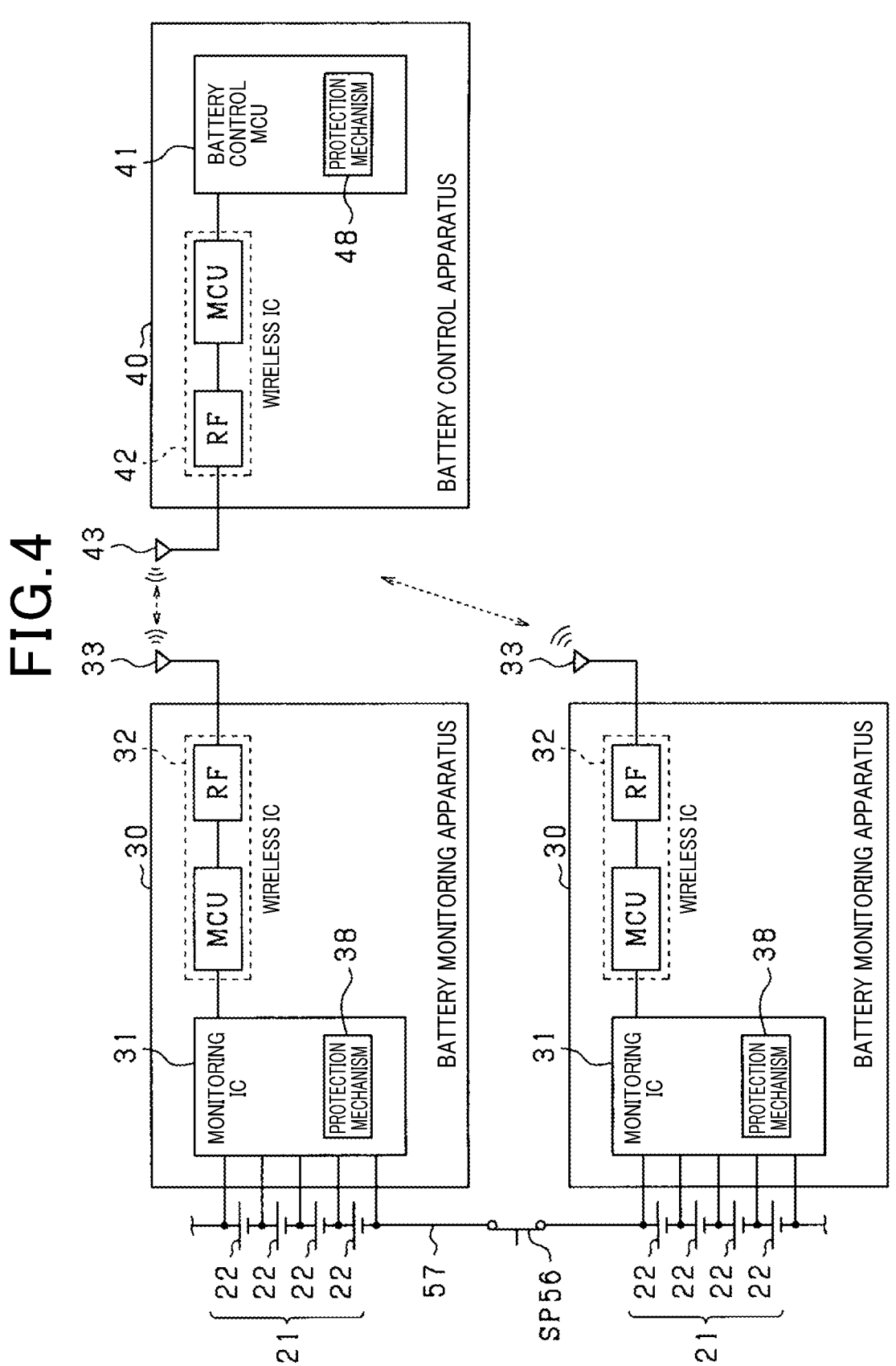
FIG. 4 is a block diagram illustrating a battery control apparatus and a battery monitoring apparatus.

The battery monitoring apparatus 30 is also referred to as a satellite battery module (SBM) and is provided for each battery block 21. As shown in FIG. 2, the battery monitoring apparatus 30 is located between the bus bar units 23 that are arranged on both ends of the battery block 21. As shown in FIG. 4, each battery monitoring apparatus 30 includes a monitoring integrated circuit (IC) 31 that is a monitoring unit, a wireless IC 32 that is a monitoring-side wireless unit, a wireless antenna 33, and the like. The monitoring IC 31 is also referred to as a cell monitoring circuit (cell supervising circuit [CSC]) and acquires battery information from each battery cell 22 that configures the battery block 21. For example, the battery information may include voltage information, temperature information, and current information of each battery cell 22, self-diagnosis information, and the like. For example, the self-diagnosis information may be information related to operation confirmation of the battery monitoring apparatus 30, that is, information related to abnormalities and failures in the battery monitoring apparatus 30, and the like. Specifically, the self-diagnosis information is information related to operation confirmation of the monitoring IC 31, the wireless IC 32, and the like that configure the battery monitoring apparatus 30.

The wireless IC 32 is connected to the monitoring IC 31 by wire, and has a wireless memory control unit (MCU), a radio frequency (RF) device, and the like. The wireless IC 32 wirelessly transmits, through the wireless antenna 33, data that is received from the monitoring IC 31. In addition, the wireless IC 32 transmits data that is received through the wireless antenna 33 to the monitoring IC 31.

Figure 5:
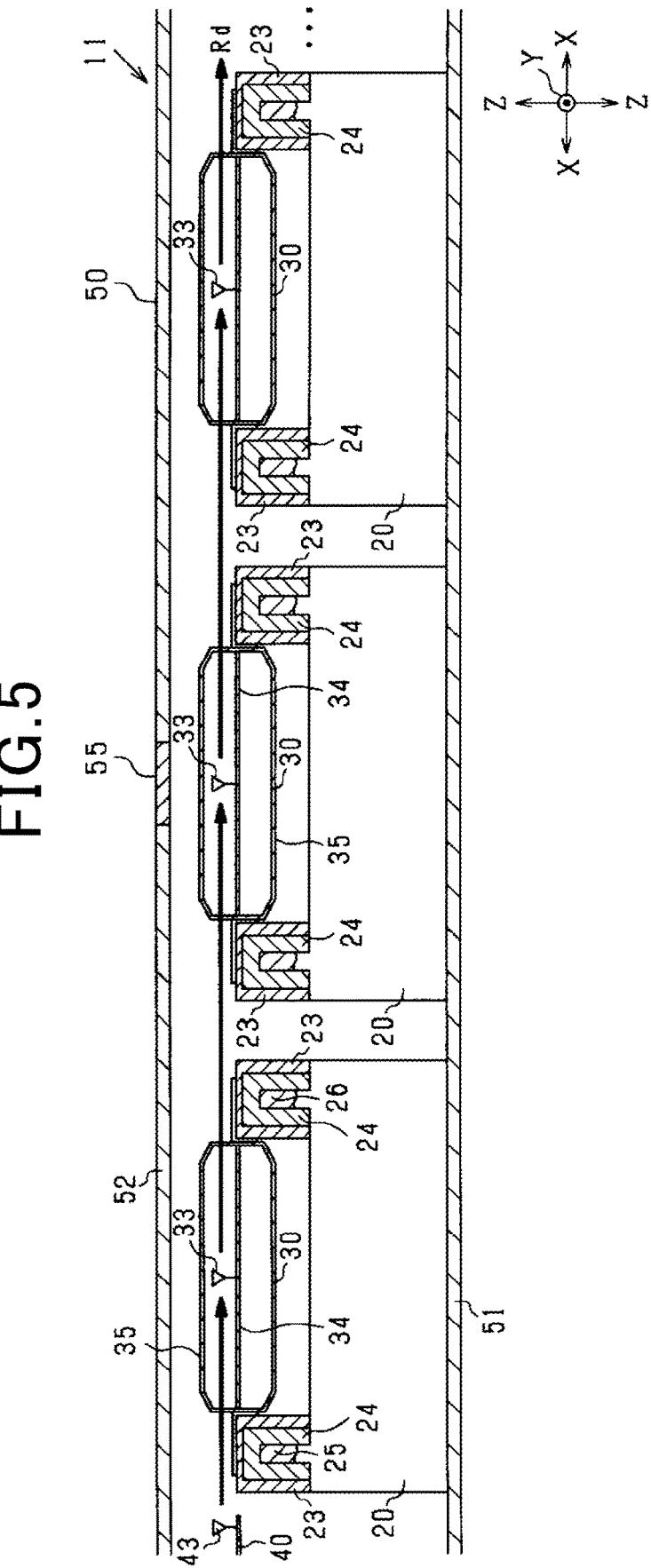
FIG. 5 is a cross-sectional view taken along line IIIa-IIIa in FIG. 3.

As shown in FIG. 3 and FIG. 5, the monitoring IC 31, the wireless IC 32, and the wireless antenna 33 are arranged on a plate-shaped substrate 34. The substrate 34 is located between the bus bar units 23 in a state of being housed in a case 35 that is made of a non-conductive body such as resin. In addition, the battery monitoring apparatus 30 is fixed to the bus bar unit 23 by a screw or the like with an attaching portion 35*a* that protrudes from the case 35 therebetween. At this time, as shown in FIG. 5, the wireless antenna 33 is provided in the substrate 34 so as not to overlap the bus bar unit 23 in the Z direction, that is, such that the wireless antenna 33 protrudes further than the bus bar unit 23 in the Z direction.

<Configuration of the Battery Control Apparatus 40>

The battery control apparatus 40 is also referred to as a battery ECU or a battery management unit (BMU). The battery control apparatus 40 is attached to an outer side surface of the battery block 21 that is arranged on one end in the X direction. The battery control apparatus 40 is configured to be capable of wirelessly communicating with each battery monitoring apparatus 30.

Specifically, as shown in FIG. 4, the battery control apparatus 40 includes a battery control MCU 41 that is a control unit, a wireless IC 42 that is a control-side wireless unit, a wireless antenna 43, and the like. The battery control MCU 41 is configured by a microcomputer that includes a CPU, a ROM, a RAM, an input/output interface, and the like. The CPU of the battery control MCU 41 loads and runs a program that is stored in the ROM in the RAM. Processes related to battery control are written in the program that is stored in the ROM.

As an example of a main process, the battery control MCU 41 instructs the battery monitoring apparatus 30 to acquire and transmit battery information. In addition, the battery control MCU 41 monitors the assembled battery 20, the battery blocks 21, and the battery cells 22 based on the battery information acquired from the battery monitoring apparatuses 30. Furthermore, the battery control MCU 41 controls a relay switch that switches between an energizing and energization-interrupted state between the assembled battery 20, and the PCU 12 and the motor 13, based on monitoring results and the like. In addition, the battery control MCU 41 may also transmit an equalization signal to equalize voltages of the battery cells 22. Here, according to the present embodiment, the vehicle ECU 14 issues instructions to the PCU 12 to perform charging/discharging control of the assembled battery 20. However, the battery control MCU 41 may be configured to be capable of issuing such instructions.

The wireless IC 42 is connected to the battery control MCU 41 by wire, and has a wireless MCU, an RF device, and the like in manner similar to the wireless IC 32. The wireless IC 42 wirelessly transmits, through the wireless antenna 43, data that is received from the battery control MCU 41. In addition, the wireless IC 42 transmits data that is received through the wireless IC 43 to the battery control MCU 41.

Here, as shown in FIG. 5, the wireless antenna 43 of the battery control apparatus 40 is arranged at about a same height as the wireless antenna 33 of the battery monitoring apparatus 30 in the Z direction. That is, the wireless antenna 43 of the battery control apparatus 40 is provided so as to protrude further than the bus bar unit 23 in the Z direction.

<Configuration of the Housing 50>

Figure 6:
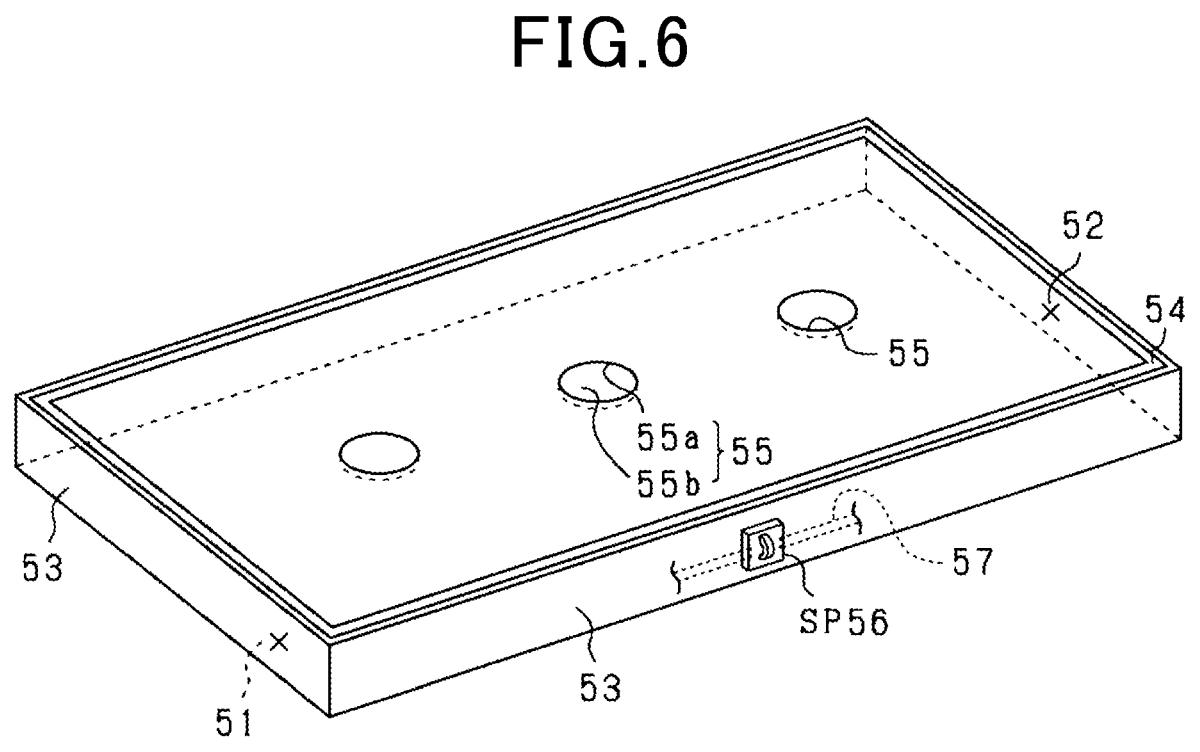

The housing 50 is configured by a conductive body such as metal. Specifically, as shown in FIG. 6, the housing 50 is formed into a box-like shape that is made of metal, and has a substantially rectangular parallelopiped shape. A bottom surface of the housing 50 is the installation surface 51 located in the vehicle 10 and is formed into a rectangular shape. In addition, a top surface (an opposing surface that opposes the installation surface 51 in the Z direction) of the housing 50 is provided with a removable housing cover 52. The housing cover 52 corresponds to a cover that covers an opening portion of the housing 50 and is attached so as to seal the opening portion of the housing 50 in a state in which the assembled battery 20 and the like are housed inside the housing 50.

A seal member 54 for filling a gap between the housing cover 52 and the housing 50 is provided on each side of the housing cover 52 or the opening portion of the housing 50. The seal member 54 is configured by a non-conductive elastic member or the like. For example, the seal member 54 may be a gasket seal or the like. According to the present embodiment, when viewed from a top surface of the housing cover 52, the seal member 54 is arranged so as to surround the wireless antennas 33 and 43. That is, in the X direction, the wireless antenna 43 and the wireless antenna 33 are arranged so as to be sandwiched between short sides of the seal member 54 that are arranged on both ends of the housing 50. In addition, in the Y direction, the wireless antenna 43 and the wireless antenna 33 are arranged so as to be sandwiched between long sides of the seal member 54 that are arranged on both Y-direction ends of the housing 50. Here, the seal member 54 may not be provided if the gap between the housing cover 52 and the housing 50 is small.

In addition, the housing cover 52 is provided with an explosion-proof valve 55 that releases internal gas when an air-pressure difference inside and outside the housing 50 is equal to or greater than a predetermined value. The explosion-proof valve 55 is configured such that, as a result of a through hole 55a that passes through the housing cover 52 being sealed by a lid member 55b and welded or the like, the lid member 55d detaches and gas is released when a difference between internal and external air pressure is equal to or greater than the predetermined value.

According to the present embodiment, when viewed from the top surface of the housing cover 52, the explosion-proof valve 55 is arranged so as to overlap a linear path that connects the wireless antenna 43 and the wireless antenna 33 (see FIG. 2 and FIG. 5). That is, the explosion-proof valve 55 is arranged between the wireless antenna 43 and the wireless antenna 33 in the X direction and arranged so as to overlap the wireless antennas 43 and 33 in the Y direction.

Here, to facilitate operation of the explosion-proof valve 55, the lid member 55b may be made of resin. Alternatively, a groove may be formed in the lid member 55b, and the lid member 55b may be configured to be easily broken when air pressure increases. In addition, the lid member 55b may be thinner than a thickness of the housing 55. Moreover, the explosion-proof valve 55 is not necessarily required to be configured such that the through hole 55a is sealed by the lid member 55b. For example, a circular groove (thin portion) may be formed in the housing cover 52. When air pressure increases, the housing cover 52 may break and a through hole may be formed. Furthermore, the explosion-proof valve 55 is not required to be formed in the housing cover 52 and may be provided on a side surface 53. A number and an arrangement of the explosion-proof valve 55 are arbitrary. However, the explosion-proof valve 55 is preferably not provided on a surface that is blocked by a vehicle body and from which gas is not easily released, such as the installation surface 51 (bottom surface).

In addition, a service plug SP 56 for electrically disconnecting an electrical path (wiring) to which the assembled battery 20 is connected and reliably stopping charging/discharging of the assembled battery 20 is provided on the side surface 53 of the housing 50. The service plug SP 56 is also referred to as a safety plug and is configured to be removable by hand. For example, as shown in FIG. 4, the service plug SP 56 may be provided on an electrical path between the battery block 21 and the battery block 21 in the assembled battery 20. The service plug SP 56 configures a portion of the electrical path. Therefore, as a result of the service plug SP 56 being removed from the housing 50, energization of the assembled battery 20 can be reliably interrupted, thereby enabling maintenance, disassembly, and the like to be subsequently safely performed.

A configuration of the service plug SP 56 will be described in detail. A plug through hole is provided in the side surface 53 of the housing 50. An electrical path 57 that is a conductive body is configured to be exposed through the plug through hole in a partially deficient state. As shown in FIG. 4, the electrical path 57 is an electrical path between the battery block 21 and the battery block 21. In addition, the electrical path 57 is covered by a non-conductive body to provide insulation from the housing 50 and to prevent electrocution. The service plug SP 56 is configured to be attachable to the housing 50 through the plug through hole.

In addition, the service plug SP 56 has a conductive body that connects the electrical path 57 and is configured to connect the electrical path 57 when attached to the housing 50. Therefore, as result of the service plug SP 56 being removed from the housing 50, the electrical path 57 can be disconnected. The service plug SP 56 is configured by the conductive body being covered by a non-conductive body such as resin. That is, the service plug SP 56 is configured by a conductive body and a non-conductive body, and is attached to the plug through hole of the housing 50.

Here, the service plug SP 56 is not required to be formed on the side surface 53 and may be provided in the housing cover 52. However, the service plug SP 56 is preferably not provided in a location in which the service plug SP 56 cannot be easily removed from the outside, such as the installation surface 51 (bottom surface).

Furthermore, the service plug SP 56 according to the present embodiment is arranged so as to overlap a linear path that connects the wireless antennas 43 and 44 in the Y direction that is a direction orthogonal (perpendicular) to the side surface 53. That is, the service plug SP 56 is arranged between the wireless antenna 43 and the wireless antenna 33 in the X direction and arranged at about a same height as the wireless antennas 43 and 33 in the Z direction.

In addition, a connector 58 for connecting the battery pack 11 to an external apparatus is provided in the side surface 53 of the housing 50. In a manner similar to the service plug SP 56, the connector 58 is also configured such that a through hole is provided in the housing 50, and the connector 58 that is configured by a conductive body and a non-conductive body is attached to the through hole. Therefore, external radio waves may pass through a portion of the connector 58 that is the non-conductive body. That is, the connector 58 corresponds to a transmissive portion.

Here, the housing 50 is substantially configured by a conductive body. Therefore, external radio waves are easily blocked. However, in the overall housing 50, radio waves are difficult to completely block and transmissive portions that allow transmission of radio waves are provided. For example, as described above, radio waves may easily infiltrate portions in which the seal member 54, the explosion-proof valve 55, the service plug SP 56, and the connector 58 are provided, and these portions are transmissive portions that allow transmission of radio waves. That is, because the seal member 54 is non-conductive, radio waves may infiltrate through the seal member 54. In addition, the explosion-proof valve 55 is partially or entirely configured to be thin so as to detach as a result of gas pressure. Alternatively, a gap is formed. Therefore, radio waves may infiltrate the explosion-proof valve 55. Furthermore, as described above, a non-conductive body is used in portions of the service plug SP 56 and the conductor 58. Radio waves may infiltrate through the portions that are the non-conductive body.

Moreover, in recent years, a portion of the housing 50 may be made thinner to reduce weight of the battery pack 11. When the housing 50 is made thinner, an arrangement and a shape thereof are determined taking into consideration overall strength of the housing 50. Radio waves easily infiltrate the thin portion.

In addition, it is also considered that the housing 50 is partially or entirely made of a non-conductive resin or being made thinner overall in the first place. In this case, infiltration of external radio waves cannot be blocked by the housing 50.

Furthermore, depending on the arrangement, sizes, and shapes of these transmissive portions, and a direction from which the radio waves from outside the housing 50 infiltrate, interference in wireless communication may occur. For example, as shown in FIG. 2 and FIG. 5, the explosion-proof valve 55 may be provided in the housing cover 52, and the wireless antennas 33 and 43 oppose the housing cover 52 without obstruction. Therefore, interference in wireless communication may occur as a result of external radio waves that pass through the explosion-proof valve 55.

In addition, as shown in FIG. 2 and FIG. 5, in the Z direction that is a direction orthogonal to the housing cover 52 in which the explosion-proof valve 55 is provided, the explosion-proof valve 55 overlaps a path that linearly connects the wireless antenna 33 and the wireless antenna 43. That is, in a predetermined direction (the Z direction according to the present embodiment), the explosion-proof valve 55 is arranged so as to overlap a transmission path for wireless communication that connects the wireless antenna 43 and the wireless antenna 33. Here, the predetermined direction is not limited to the Z direction and may be arbitrarily changed. For example, the predetermined direction may be a direction in which radio waves from outside most easily pass. Alternatively, the predetermined direction may be a thickness direction of a surface (the housing cover 52 according to the present embodiment) on which the transmissive portion (such as the explosion-proof valve 55) is provided. Here, in FIG. 2, a position of the explosion-proof valve 55 is indicated by a broken line. In this case, the radio waves that infiltrate through the explosion-proof valve 55 may cause interference in wireless communication.

Furthermore, when viewed from a specific direction (such as the Z direction), either of the wireless antennas 33 and 43 is arranged within a range of projection dimensions of the explosion-proof valve 55. In addition, when viewed from a specific direction (such as the Z direction), the transmission path (linear path) for wireless communication that connects the wireless antenna 43 and the wireless antenna 33 passes through the range of projection dimensions of the explosion-proof valve 55. Therefore, external radio waves in the Z direction that infiltrate through the explosion-proof valve 55 may cause interference in wireless communication.

In a similar manner, the seal member 54 is provided in the housing cover 52, and the wireless antennas 33 and 43 oppose the housing cover 52. In addition, when viewed from the Z direction, the seal member 54 is arranged so as to surround a periphery of the wireless antennas 33 and 34. That is, the seal member 54 is provided in an overall area of a path that linearly connects the wireless antenna 33 and the wireless antenna 43 (the transmission path for wireless communication). Therefore, external radio waves that infiltrate through the seal member 54 may cause interference in wireless communication.

Furthermore, the service plug SP 56 is arranged so as to overlap a linear path that connects the wireless antennas 43 and 44 (the transmission path for wireless communication) in the Y direction that is a direction orthogonal (perpendicular) to the side surface 53. That is, the service plug SP 56 is arranged so as to overlap the transmission path for wireless communication that connects the wireless antenna 43 and the wireless antenna 33 from a direction differing from that of the explosion-proof valve 55. Therefore, external radio waves in the Y direction that infiltrate through the service plug SP 56 may cause interference in wireless communication.

Therefore, according to the present embodiment, a configuration and a wireless communication method such as that below are used to enable wireless communication to be reliably performed. Here, the configuration and the wireless communication method for enabling wireless communication to be reliably performed will be described in detail. Hereafter, details of protection mechanisms 38 and 48 will be described following a brief description of an overview of wireless communication. Then, the wireless communication method according to the present embodiment will be described last. Here, wireless communication related to acquisition of battery information will be described as a premise.

<Overview of Wireless Communication>

When wireless communication is performed according to the present embodiment, first, wireless data that instructs acquisition and transmission of battery information is transmitted from the battery control apparatus 40. More specifically, the battery control MCU 41 of the battery control apparatus 40 generates a data unit that includes an acquisition instruction command that instructs acquisition of battery information and transmission thereof, and the like, and transmits the data unit to the wireless IC 42 by wire.

The wireless IC 42 of the battery control apparatus 40 adds data (information) that is required for wireless communication, such as communication control information, to the received data unit and generates wireless data. The wireless IC 42 of the battery control apparatus 40 wirelessly transmits the generated wireless data through the wireless antenna 43.

When the wireless data is wirelessly received by the battery monitoring apparatus 30, the battery information is acquired based on the acquisition instruction command that is included in the wireless data. Wireless data that includes the acquired battery information and the like is transmitted (returned) to the battery control apparatus 40 side.

More specifically, upon receiving the wireless data through the wireless antenna 33, the wireless IC 32 of the battery monitoring apparatus 30 determines whether the wireless data is wireless data that is addressed to the wireless IC 32 itself, based on the communication control information in the wireless data. When determined that the wireless data is wireless data that is addressed to the wireless IC 32 itself, the wireless IC 32 retrieves the unit data from the wireless data and transmits the data unit to the monitoring IC 31 by wire.

Upon receiving the data unit from the wireless IC 32, the monitoring IC 31 retrieves the acquisition instruction command from the data unit and acquires the battery information from the battery cells 22 based on the acquisition instruction command. Then, the monitoring IC 31 converts the acquired battery information to electronic data and generates a data unit that is transmitted to the battery control apparatus 40. The monitoring IC 31 transmits the generated data unit to the wireless IC 32 by wire.

Upon acquiring the data unit from the monitoring IC 31, the wireless IC 32 adds data (information) that is required for wireless communication, such as communication control information, to the data unit and generates wireless data. The wireless IC 32 of the battery monitoring apparatus 30 transmits (returns) the generated wireless data through the wireless antenna 33.

Then, upon receiving the wireless data that includes the data of the battery information, the battery control apparatus 40 acquires the battery information from the wireless data. More specifically, upon receiving the wireless data though the wireless antenna 42, the wireless IC 42 of the battery control apparatus 40 determines whether the wireless data is wireless data that is addressed to the wireless IC 42 itself, based on the communication control information in the wireless data. When determined that the wireless data is wireless data that is addressed to the wireless IC 42 itself, the wireless IC 42 retrieves the data unit from the wireless data and transmits the data unit to the battery control MCU 41 by wire.

Upon receiving the data unit from the wireless IC 42, the battery control MCU 41 acquires the battery information from the data unit. Then, the battery control MCU 41 performs various types of control based on the battery information. For example, the battery control MCU 41 may notify the external vehicle ECU 14 and the like of the received battery information. In addition, when an abnormality is detected in the battery cell 22 based on the battery information, the battery control MCU 41 outputs a signal to the external vehicle ECU 14 and the like to stop charging/discharging of the assembled battery 20. Furthermore, when variations occur in the voltages of the battery cells 22, the battery control MCU 41 performs an equalization process.
Configurations of the Protection Mechanisms 38 and 48>

The battery monitoring apparatus 30 and the battery control apparatus 40 are respectively provided with the protection mechanisms 38 and 48 for protecting battery information when wireless communication is performed. The protection mechanisms 38 and 48 are respectively provided in the monitoring IC 31 and the battery control MCU 41. Specifically, the monitoring IC 31 functions as the protection mechanism 38 as a result of the CPU running a program that is stored in the ROM. In a similar manner, the battery control MCU 41 functions as the protection mechanism 48 as a result of the CPU running a program that is stored in the ROM. Here, the protective mechanisms 38 and 48 may be configured by hardware (such as circuits) and mounted in the monitoring IC 31 and the battery control MCU 41.

The battery information that is transmitted and received by wireless communication is protected by the protection mechanisms 38 and 48 on the transmission side and the reception side cooperatively inspecting whether the battery information is correctly transmitted and received. According to the present embodiment, of the protection mechanisms 38 and 48, the protection mechanism 38 or 48 that serves as the transmission side generates inspection data based on rules that are determined in advance, when data to be transmitted is generated, that is, when the data unit to be transmitted to the wireless IC 32 or 42 is generated. The inspection data is included in the data unit, and is data for inspecting and protecting message data such as the battery information that is included in the data unit.

In addition, of the protection mechanisms 38 and 48, the protection mechanism 38 or 48 that serves as the reception side inspects the received data unit based on the inspection data in the received data unit, based on rules that are determined in advance. After whether transmission and reception of the data unit are correctly performed is inspected (analyzed), the message data that is the protected data that is included in the data unit is acquired. According to the present embodiment, the protection mechanisms 38 and 48 may be configured such that a plurality of types of inspections, for example, a cyclic redundancy check (CRC), an identification (ID) check, a sequence check, and a timeout check, can be performed. Here, not all inspection methods are required to be performed at all times. Some of the inspection methods may be selected and performed as required. In addition, inspection may not be performed in some cases. Each inspection method will be described below.
<Cyclic Redundancy Check>

The cyclic redundancy check is a type of inspection in which an error detection code is used. Of the protection mechanisms 38 and 48, the protection mechanism 38 or 48 that serves as the transmission side considers the transmitted message data as a value, divides the value by a generating polynomial that is determined in advance, and generates a remainder of the division as CRC data. Then, the protection mechanism 38 or 48 that serves as the transmission side includes the CRC data in the inspection data of the data unit to be transmitted. The protection mechanism 38 or 48 that serves as the reception side considers the message data that is the received protected data as a value, divides the value by the same generating polynomial as that on the transmission side, compares a remainder of the division with the CRC data that is included in the received inspection data, and analyzes whether an error or corruption has occurred in the message data.

Figure 7:
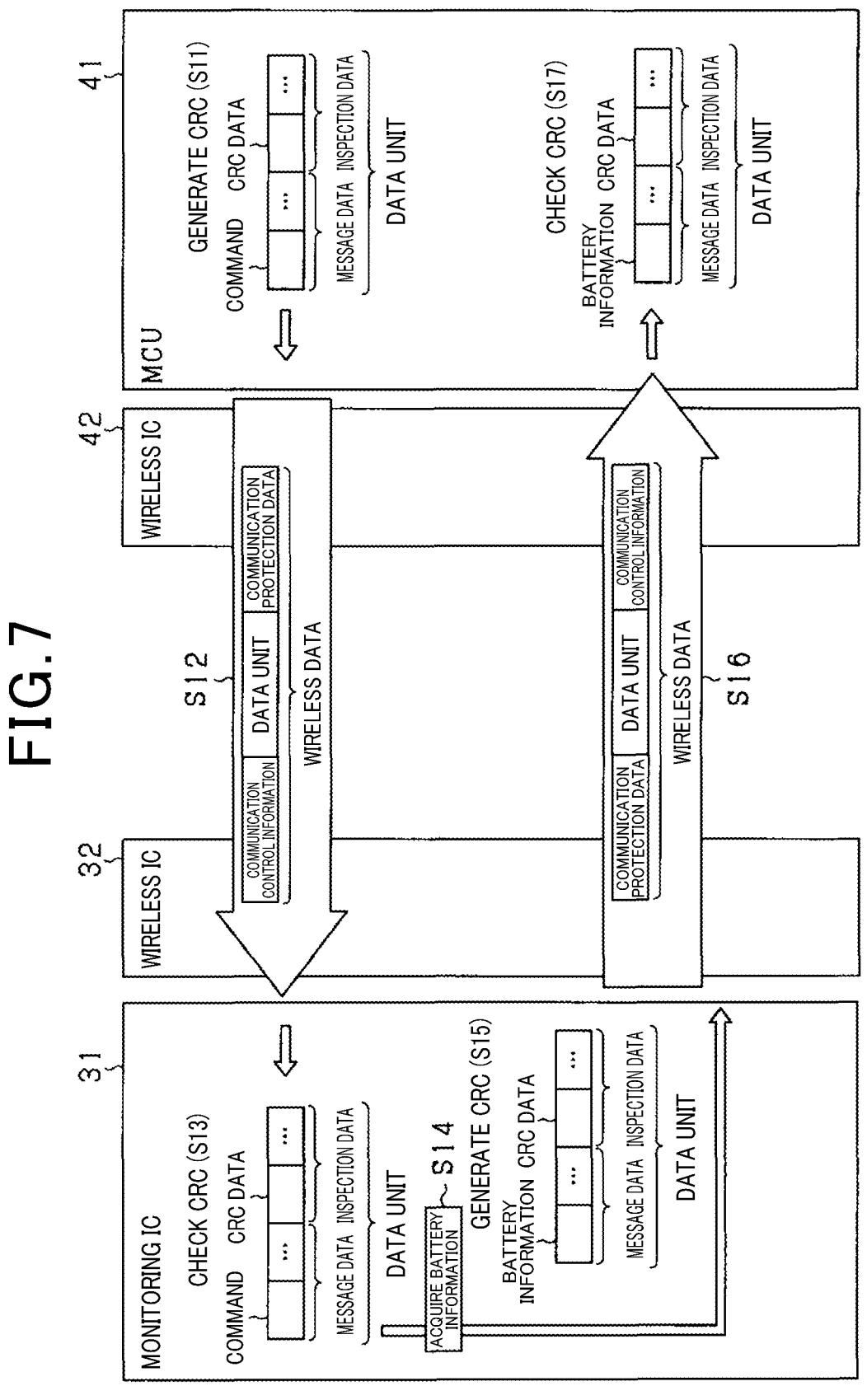
FIG. 7 is a diagram schematically illustrating a flow of a cyclic redundancy check.

A more detailed description will be given with reference to FIG. 7. In FIG. 7, the acquisition instruction command and the battery information being transmitted and received is assumed as described above. When the acquisition instruction command is transmitted, the protection mechanism 48 of the battery control MCU 41 considers the message data that includes the acquisition instruction command as a value, divides the value by a generating polynomial that is determined in advance, and generates a remainder of the division as the CRC data (step S11). Then, the battery control MCU 41 generates a data unit from the message data that includes the acquisition instruction command and the like and the inspection data that includes the CRC data and the like, and transmits the data unit to the battery monitoring apparatus 30 through the wireless IC 42 and the like, as described above (step S12).

Upon receiving the data unit through the wireless IC 32 and the like, the protection mechanism 38 of the monitoring IC 31 considers the message data in the data unit as a value, divides the value by the same generating polynomial as that on the transmission side, and calculates a remainder of the division. Then, the monitoring IC 31 compares the calculated remainder (CRC data) and the CRC data that is included in the inspection data of the received data unit and analyzes (inspects) whether an error or corruption has occurred in the message data (step S13).

After inspection, when determined that the data unit is normally received, the monitoring IC 31 performs a process based on the acquisition instruction command that is included in the message data. That is, the monitoring IC 31 acquires the battery information from the battery cell 22 (step S14) and generates a data unit by converting the acquired battery information to electronic data, (step S15). At step S15, the protection mechanism 38 of the monitoring IC 31 considers the message data that includes the battery information and the like as a value, divides the value by a generating polynomial that is determined in advance, and generates a remainder of the division as the CRC data. Then, the monitoring IC 31 generates a data unit from the message data that includes the battery information and the like, and the inspection data that includes the CRC data and the like (S15), and transmits the data unit to the battery control apparatus 40 through the wireless IC 32 and the like, as described above (step S16).

Upon receiving the data unit through the wireless IC 42 and the like, the protection mechanism 48 of the battery control MCU 41 considers the message data that includes the battery information and the like as a value, divides the value by the same generating polynomial as that on the transmission side, and calculates a remainder of the division. Then, the battery control MCU 41 compares the calculated remainder (CRC data) and the CRC data that is included in the received data unit, and analyzes (inspects) whether an error or corruption has occurred in the message data (S17). When determined that the data unit is normally received, the battery control MCU 41 performs various types of control as described above, based on the battery information in the message data. Meanwhile, when determined that an error or corruption has occurred in the message data, the battery control MCU 41 determines that a communication error has occurred and performs a process based on the communication error. For example, the process based on the communication error may include notification to an external apparatus and retransmission of the data unit.

Here, according to this embodiment, when the CRC data is generated, the message data is considered as a value. However, any type of data may be considered as a value. Data other than the CRC data may be inspected in the cyclic redundancy check. That is, a range that is considered as a value may be arbitrarily changed in the cyclic redundancy check. For example, an address of a transmission destination, an ID number, a sequence number, or the like may be inspected and protected in the cyclic redundancy check.

In addition, although the acquisition instruction command is subjected to the cyclic redundancy check, the acquisition instruction command may not be subjected thereto. That is, the battery control MCU 41 adding the CRC data when transmitting the acquisition instruction command and the monitoring IC 31 inspecting whether the acquisition instruction command is correctly received based on the CRC data is not necessary.

<ID Check>

The ID check is a method for adding an ID number and inspecting whether a transmission source is correct. In the ID check, the protection mechanism 30 or 48 that serves as the transmission side generates inspection data that includes an ID number (identification number) that is unique to the transmission-side apparatus. Then, in the ID check, the protection mechanism 38 or 48 that serves as the reception side determines whether the received ID number coincides with the ID number that is unique to the transmission-side apparatus, and thereby determines whether the transmission is from the correct transmission source. Here, the reception side is assumed to acquire, authenticate, and store the ID number that is unique to the transmission-side apparatus in advance.

Figure 8:
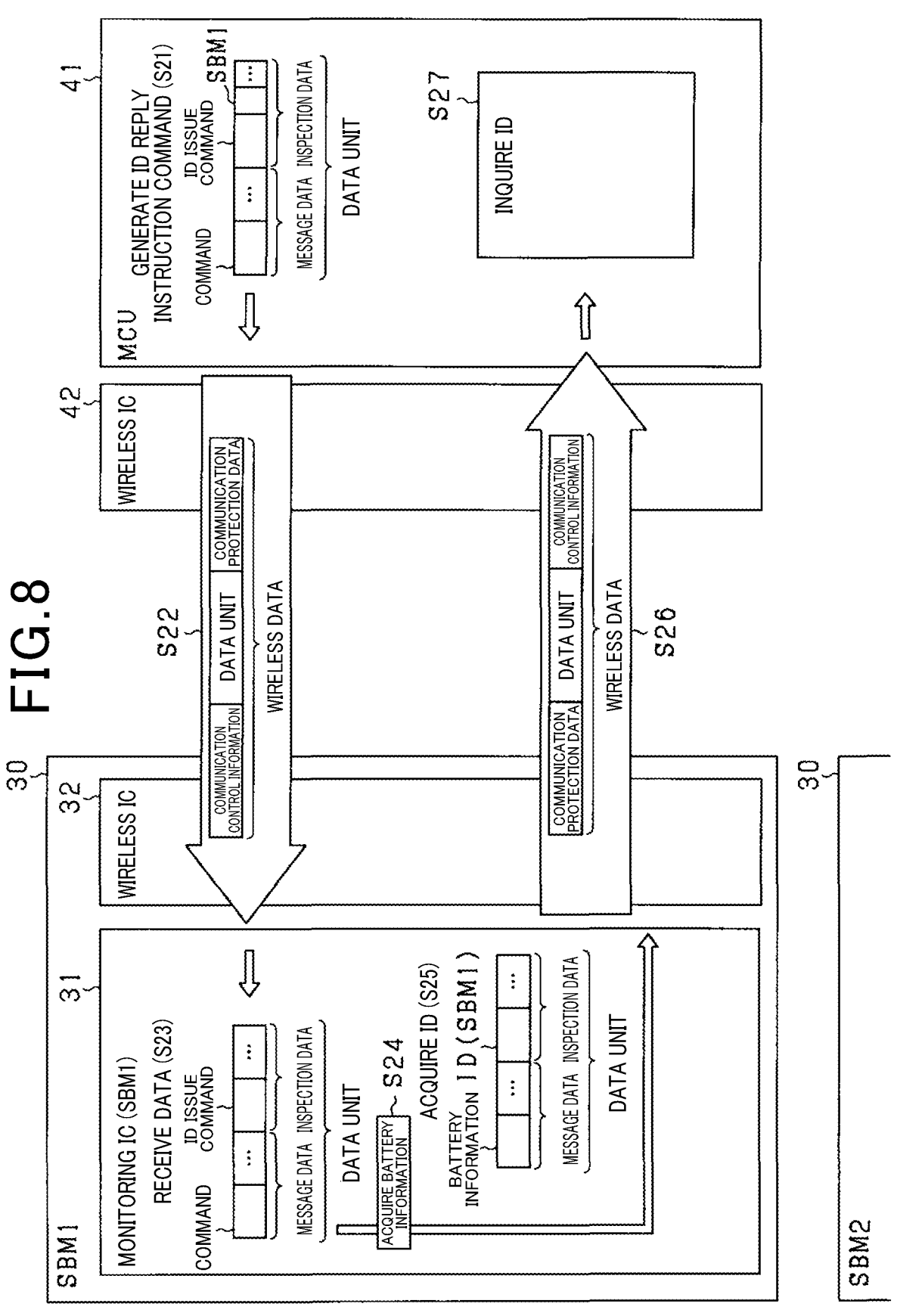
FIG. 8 is a diagram schematically illustrating a flow of an ID check.

A more detailed description will be given with reference to FIG. 8. In FIG. 8, the acquisition instruction command and the battery information being transmitted and received is assumed as described above. The protection mechanism 48 of the battery control MCU 41 generates an ID reply instruction command by combining an ID issue command that instructs that the ID number is attached and returned, and an address that designates the monitoring IC 31 that serves as the transmission source of the ID number (step S21). In FIG. 8, the address that designates the monitoring IC 31 that serves as the transmission source is SBM1.

Then, the battery control MCU 41 includes the ID reply instruction command in the inspection data and generates a data unit. The battery control MCU 41 transmits the generated data unit to the battery monitoring apparatus 30 through the wireless IC 42 and the like, as described above (step S22).

Here, the ID check is not required to be performed every time for all monitoring ICs 31. For example, the ID check may be performed at every fixed period. Alternatively, the ID check may be performed only in a circumstance in which the battery information is to be acquired with certainty. In addition, although the monitoring IC 31 that serves as the transmission source of the ID number is designated, the monitoring IC 31 that serves as the transmission source of the ID number may not be designated, and only the ID issue command may be used.

Furthermore, according to the present embodiment, the ID reply instruction command is included in the inspection data. However, the ID reply instruction command may be included in the message data together with the acquisition instruction command and protected so as to be accurately transmitted by another inspection (such as the cyclic redundancy check).

Upon receiving the data unit through the wireless IC 32 and the like (step S23), the monitoring IC 31 performs a process based on the acquisition instruction command that is included in the message. That is, the monitoring IC 31 acquires the battery information from the battery cell 22 (step S24) and generates the data unit by converting the acquired battery information to electronic data (step S25).

At step S25, the protection mechanism 38 of the monitoring IC 31 determines whether the ID reply instruction command is included in the inspection data of the received data unit. When the ID rely instruction command is included, the protection mechanism 38 of the monitoring IC 31 determines whether the monitoring IC 31 itself is designated as the transmission source of the ID number based on the ID reply instruction command. When the monitoring IC 31 itself is designated as the transmission source of the ID number, at step S25, the protection mechanism 38 of the monitoring IC 31 acquires the ID number (identification number) that is unique to the monitoring IC 31 that serves as the transmission source based on the ID issue command of the ID reply instruction command. Here, for example, the ID number may be a manufacturing number (serial number) of the monitoring IC 31 or the like and is stored in the ROM of the monitoring IC 31 or the like.

Then, the monitoring IC 31 generates a data unit by combining the inspection data that includes the ID number and the like, and the message data that includes the battery information and the like, and transmits the data unit to the battery control apparatus 40 through the wireless IC 32 and the like, as described above (step S26).

Upon receiving the data unit through the wireless IC 42 and the like, the protection mechanism 48 of the battery control MCU 41 determines whether an ID number is included in the inspection data. When determined that an ID number is included, the protection mechanism 48 of the battery control MCU 41 inquires (determines) whether the acquired ID number is present in a list of ID numbers that are authenticated and stored as transmission sources (step S27). When the acquired ID number coincides with a stored ID number, the battery control MCU 41 determines that the transmission source is correct.

When determined that the received data unit is correct by various types of inspections, the battery control MCU 41 performs various types of control as described above based on the battery information that is included in the message data. Meanwhile, when determined that the transmission source is not correct, the battery control MCU 41 determines that a communication error has occurred and performs a process based on the communication error.

<Sequence Check>

The sequence check is a method for inspecting whether data is transmitted and received following a communication schedule. In the sequence check, the protection mechanism 38 or 48 that serves as the transmission side generates inspection data that includes a sequence number based on a communication schedule and transmits the inspection data. Then, based on the sequence number that is included in the inspection data in a received data unit, the protection mechanism 38 or 48 that serves as the reception side determines whether reception of the data unit follows the communication schedule, and thereby inspects whether the data is transmitted and received following the communication schedule.

Figure 9:
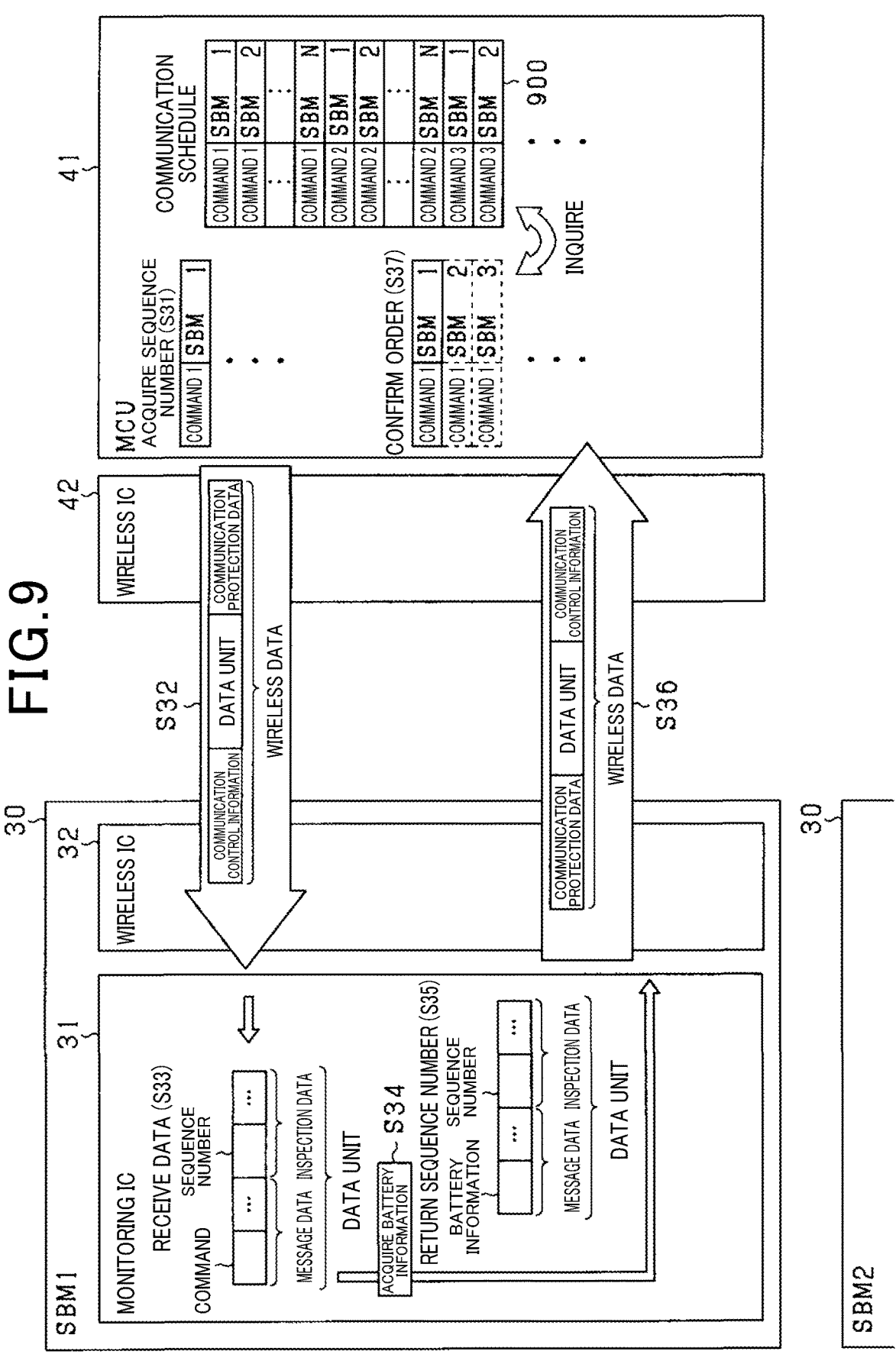
FIG. 9 is a diagram schematically illustrating a flow of a sequence check.

A more detailed description will be given with reference to FIG. 9. In FIG. 9, the acquisition instruction command and the battery information being transmitted and received is assumed as described above. As shown in FIG. 9, in a communication schedule 900 described above, sequence numbers are set based on an order of transmission. The communication schedule 900 is stored in the battery control MCU 4. The sequence numbers may be arbitrary numbers as long as the numbers are distinguishable, that is, a same number is not repeated. According to this embodiment, the sequence number is composed of a combination of an identification number (such as an address or an ID number) that indicates the monitoring IC 31 that serves as the transmission destination and a command issued to the transmission destination at this time.

For example, in the communication schedule 900 shown in FIG. 9, the sequence number that is first in the order of transmission may be configured by: an address (SBM1) that designates a first monitoring IC 31 from the X direction as the transmission destination; and a command 1. In FIG. 9, the command 1 is the acquisition instruction command. However, the command 1 may be another command (such as an equalization command that instructs an equalization process). In addition, in the communication schedule 900 shown in FIG. 9, the sequence number that is second in the order of transmission is composed of an address (SBM2) that designates a second monitoring IC 31 from the X direction as the transmission destination and the command 1.

The sequence numbers are similarly set, and the sequence number that is Nth in the order of transmission is composed of an address (SBMN) that designates an Nth monitoring IC 31 that is a last row from the X direction as the transmission destination and the acquisition instruction command (command 1). Next, the sequence number that is N+1th in the order of transmission is composed of an address (SBM1) that designates the first monitoring IC 31 from the X direction as the transmission destination and a command 2. The command 2 may be the acquisition instruction command or another command. However, even when instruction details are the same, the command 1 and the command 2 are preferably configured to be distinguishable.

Subsequently, the sequence numbers are set in the communication schedule 900 in a similar manner. Here, the communication schedule 900 is stored in a storage apparatus or the like in advance. However, an interruption may be performed based on an external request or the like, and the communication schedule 900 may be updated.

Then, the battery control MCU 41 identifies the monitoring IC 31 that is the transmission destination and the transmitted command based on the communication schedule 900 and generates a data unit to be transmitted to the transmission destination. At this time, the battery control MCU 41 includes the sequence number that is acquired by the protection mechanism 48 in the inspection data and generates the data unit (step S31). Then, the battery control MCU 41 transmits the generated data unit to the battery monitoring apparatus 30 through the wireless IC 42 and the like, as described above (step S32).

As described above, upon receiving the data unit through the wireless IC 32 and the like (step S33), the monitoring IC 31 performs a process based on the acquisition instruction command in the message data (step S34). At step S34, the monitoring IC 31 acquires the battery information from the battery cell 22 based on the acquisition instruction command. Then, the monitoring IC 31 generates the data unit by converting the acquired battery information to electronic data (step S35). At step S35, the protection mechanism 38 of the monitoring IC 31 acquires the sequence number that is included in the inspection data of the received data unit and includes the sequence number in the inspection data of the data unit to be returned. As described above, the monitoring IC 31 generates the data unit from the inspection data, the battery information, and the like, and transmits the generated data unit to the battery control apparatus 40 through the wireless IC 32 and the like (step S36).

As described above, upon receiving the data unit through the wireless IC 42 and the like, the battery control MCU 41 inquires (determines) whether the data is transmitted and received following the communication schedule from the sequence number that is included in the inspection data (step S37).

For example, as shown in FIG. 10(a), when the sequence number is missing, a determination can be made that transmission and reception of data are not appropriately performed. In addition, as shown in FIG. 10(b), when an order of reception of the sequence numbers is reversed, a determination can be made that transmission and reception of data are not appropriately performed. Alternatively, as shown in FIG. 10(c), when a sequence number is followed by the same sequence number, a determination can be made that transmission and reception of data have not been appropriately performed.

When determined that transmission and reception of data are not appropriately performed, the battery control MCU 41 determines that a communication error has occurred and performs a process based on the communication error. When determined that transmission and reception of data are appropriately performed, the battery control MCU 41 performs various types of control as described above based on the battery information that is the protected data.

<Timeout Check>

The timeout check is a method for inspecting whether a delay in data is present. In the timeout check, the protection mechanism 38 or 48 that serves as the transmission side generates inspection data that includes a sequence number in a manner similar to that described above, based on a timing that is determined by the communication schedule 900, and transmits the inspection data. The protection mechanism 38 or 48 that serves as the reception side references the communication schedule 900 and, based on the sequence number that is included in the inspection data of a received data unit, determines whether the received data unit is received within a predetermined amount of time from a reception timing that is determined in advance. In addition, the protection mechanism 38 or 48 that serves as the reception side references the communication schedule 900 and detects a communication error when data that is delayed by the predetermined amount of time or greater from the reception timing is present.

Figure 11:
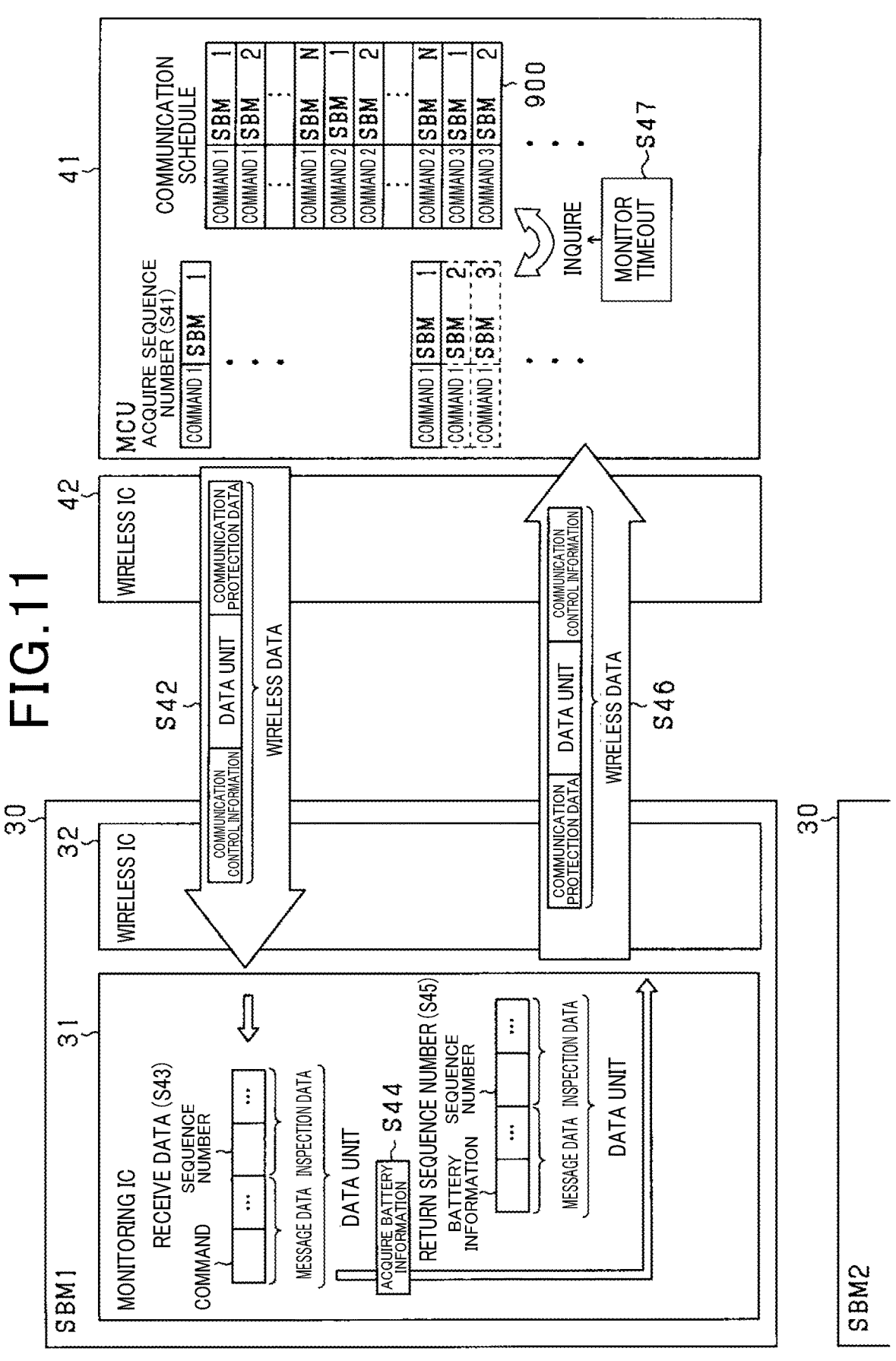
FIG. 11 is a diagram schematically illustrating a flow of a timeout check.

A more detailed description will be given with reference to FIG. 11. In FIG. 11, the acquisition instruction command and the battery information being transmitted and received is assumed as described above. The battery control MCU 41 identifies the monitoring IC 31 that is the transmission destination and the command to be transmitted based on the communication schedule 900 and generates a data unit to be transmitted to the transmission destination. At this time, the protection mechanism 48 of the battery control MCU 41 includes the sequence number in the inspection data based on the communication schedule 900 (step S41). The battery control MCU 41 generates the data unit from the inspection data, the acquisition instruction command, and the like, and transmits the generated data unit to the battery monitoring apparatus 30 through the wireless IC 42 and the like at the timing that is determined in the communication schedule 900 (step S42).

As described above, upon receiving the data unit through the wireless IC 32 and the like (step S43), the monitoring IC 31 performs a process based on the command that is the protected data. Based on the premise, the acquisition instruction command is received. Therefore, the monitoring IC 31 acquires the battery information from the battery cells 22 (step S44) and generates the data unit by converting the acquired battery information to electronic data (step S45).

At step S45, the protection mechanism 38 of the monitoring IC 31 includes the sequence number that is included in the inspection data of the received data unit in the inspection data to be returned. The monitoring IC 31 generates the data unit that includes the inspection data, the battery information, and the like, and transmits the generated data unit to the battery control apparatus 40 through the wireless IC 32 and the like (step S46).

As described above, upon receiving the data unit through the wireless IC 42 and the like, the battery control MCU 41 determines whether the data is transmitted and received within an amount of time that is prescribed by the communication schedule 900 from the sequence number included in the inspection data (step S47). That is, the battery control MCU 41 monitors whether an amount of time from a timing at which the sequence number that is included in the inspection data is transmitted (time of processing at step S42) to a timing at which the sequence number that is included in the inspection data is received (time of processing at step S47) is within an amount of time that is determined in advance.

When the sequence number of the data unit is not returned within the determined amount of time after the data unit is transmitted, the battery control MCU 41 determines that a communication error has occurred. When determined that a communication error has occurred, the battery control MCU 41 performs a process based on the communication error.

<Communication Protection in the Wireless ICs>

As described above, according to the present embodiment, when data is transmitted and received in a communication layer that is between the battery control MCU 41 and the monitoring IC 31, data protection by the protection mechanisms 38 and 48 is performed. In addition, according to the present embodiment, data protection is also performed in a communication layer that is between the wireless ICs 32 and 42.

When wireless data is transmitted and received between the wireless ICs 32 and 42, the wireless data is protected by the wireless ICs 32 and 42 on the transmission side and the reception side cooperatively inspecting whether the wireless data is correctly transmitted and received.

Specifically, as indicated at step S12, step S16, and the like in FIG. 7, upon receiving the data unit from the battery control MCU 41 or the monitoring IC 31, the wireless IC 32 or 42 that serves as the transmission side adds communication control information and communication protection data to the data unit, generates wireless data, and wirelessly transmits the wireless data. For example, the communication control information may be information that is required when wireless communication is performed, such as addresses of a transmission source and a transmission destination. The communication protection data is data for inspecting and protecting the communication control information and is generated by the wireless IC 32 or 42 on the transmission side based on rules that are determined in advance. As shown in FIG. 7 and the like, the communication control information is transmitted and received before the data unit in terms of time series. The communication protection data is transmitted and received after the data unit in terms of time series.

Then, the wireless IC 32 or 42 that serves as the reception side inspects the received communication control information based on the communication protection data in the received wireless data, based on the rules that are determined in advance, and analyzes (determines) whether transmission and reception of the wireless data are correctly performed. After analysis, the wireless IC 32 or 42 acquires the data unit and transmits the data unit to the battery control MCU 41 or the monitoring IC 31.

According to the present embodiment, a plurality of types of inspections are performed by the wireless ICs 32 and 42, in a manner similar to the protection mechanisms 38 and 48. That is, a cyclic redundancy check, an ID check, a sequence check, a timeout check, and the like are performed. Here, details of the cyclic redundancy check, the ID check, the sequence check, and the timeout check are similar to those by the protection mechanisms 38 and 48. Therefore, detailed descriptions thereof are omitted.

These inspections are performed by the CPUs of the wireless ICs 32 and 42 running programs that are stored in the ROMs of the wireless ICs 32 and 42. Here, an inspection means may be configured by hardware (such as circuits) and mounted in the wireless ICs 32 and 42.

<Wireless Communication Method>

Figure 12:
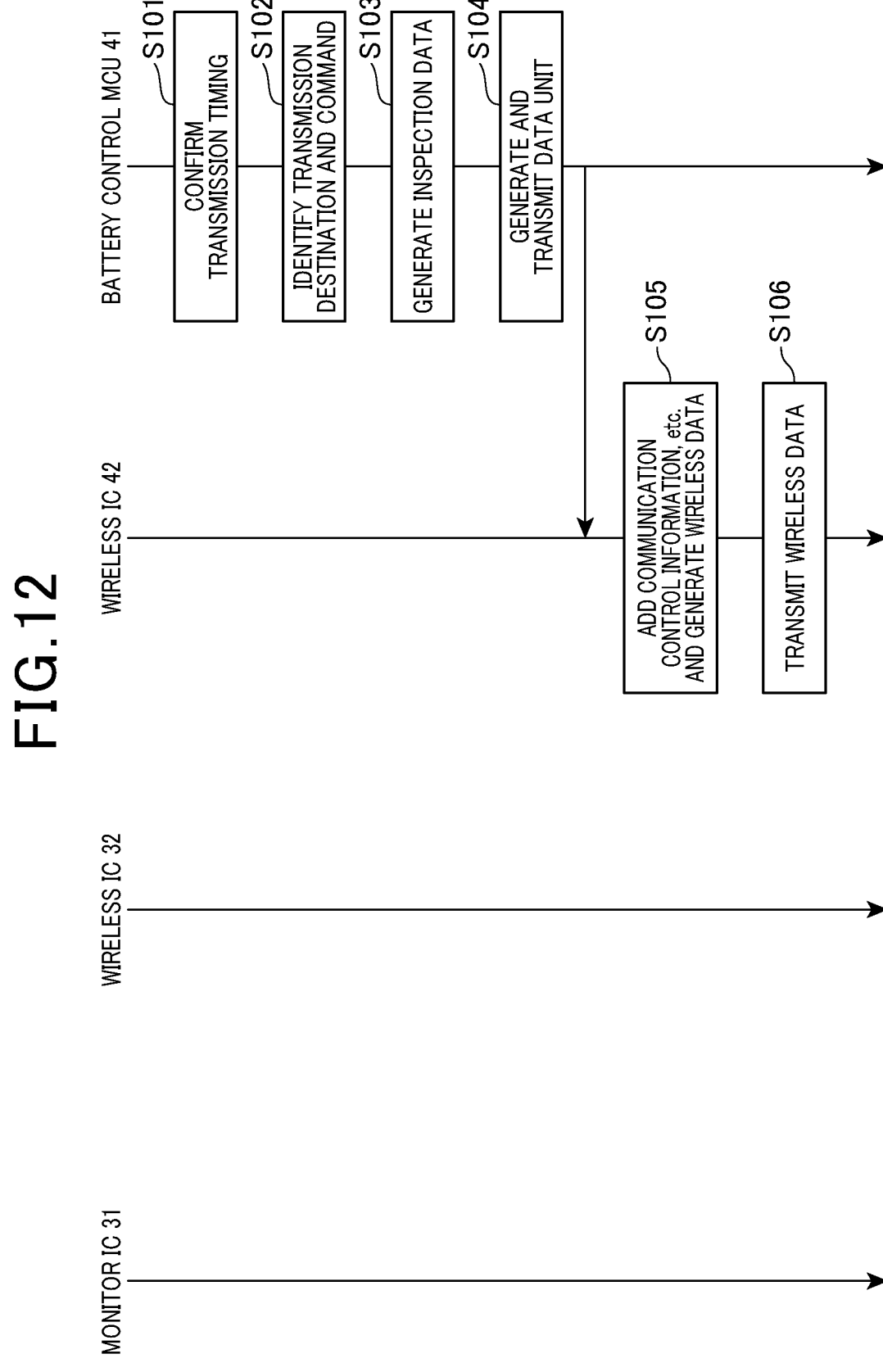
FIG. 12 is a sequence diagram illustrating a flow of a wireless communication method.
Figure 13:
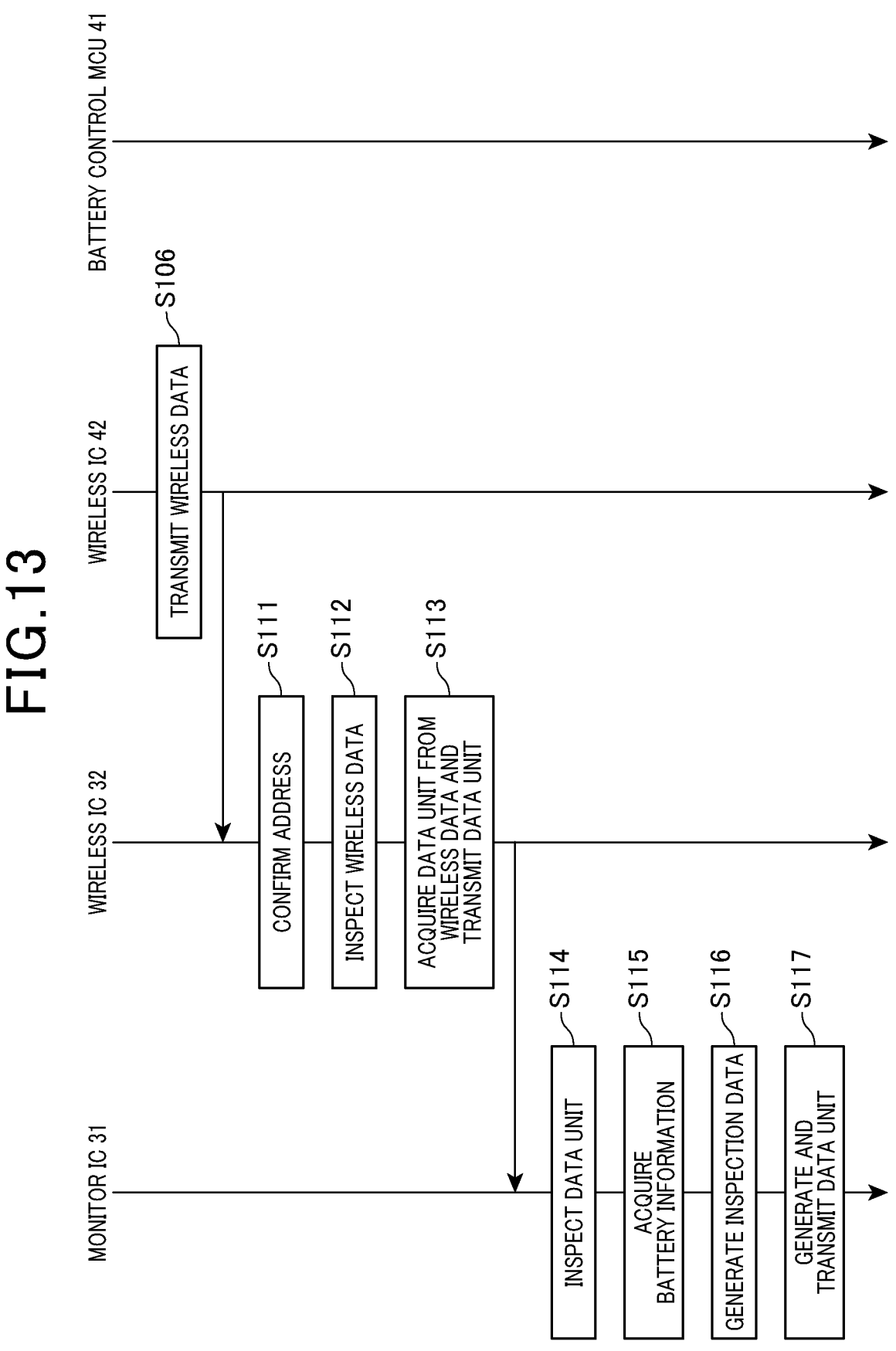
FIG. 13 is a sequence diagram illustrating the flow of the wireless communication method.

Next, a wireless communication method will be described with reference to FIG. 12 to FIG. 14. Here, in FIG. 12 to FIG. 14, a command that is transmitted from the battery control apparatus 40 is assumed to be the acquisition instruction command for battery information. As shown in FIG. 12, first, the battery control MCU 41 of the battery control apparatus 40 confirms a transmission timing based on the communication schedule 900 (step S101). That is, the battery control MCU 41 determines whether the transmission timing is reached. When the transmission timing is reached, the battery control MCU 41 identifies the monitoring IC 31 that is the transmission destination and the command to be transmitted based on the communication schedule 900 (step S102).

Next, the battery control MCU 41 sets the message data that is the protected data and generates the inspection data (step S103). The message data may only be the acquisition instruction command to be transmitted. Alternatively, the message data may be set to include other pieces of information (data) such as the address of the monitoring IC 31 that is the transmission destination. In addition, the protection mechanism 48 generates the inspection data based on the inspection method to be performed. For example, when the cyclic redundancy check is performed, the CRC data may be generated and included in the generated inspection data as described above. In a similar manner, when the ID check is performed, the ID reply instruction command is generated and included in the inspection data. Furthermore, when the sequence check and the timeout check are performed, the sequence number is acquired and included in the generated inspection data as described above. For example, the configuration may be such that the inspection method that is performed is selected based on the communication schedule 900.

Then, the battery control MCU 41 generates a data unit from the message data and the inspection data, and transmits the data unit to the wireless IC 42 (step S104). Upon receiving the data unit from the battery control MCU 41, the wireless IC 42 adds the communication control information and the communication protection data to the data unit, and generates wireless data (step S105). The communication protection data is generated based on the inspection method that is performed.

Then, the wireless IC 42 transmits the generated wireless data through the wireless antenna 43 (step S106). As shown in FIG. 13, upon receiving the wireless data through the wireless antenna 33, the wireless IC 32 that serves as the reception side confirms (determines) whether the wireless data is wireless data that is addressed to the wireless IC 32 itself, based on the communication control information in the wireless data (step S111). When the wireless data is not wireless data that is addressed to the wireless IC 32 itself, the wireless IC 32 ends the process.

Upon confirming that the wireless data is wireless data that is addressed to the wireless IC 32 itself, the wireless IC 32 inspects the received communication control information based on the communication protection data in the received wireless data, and analyzes (inspects) whether transmission and reception of the wireless data are correctly performed (step S112). When determined that transmission and reception of the wireless data are not correctly performed, the wireless IC 32 performs a process based on the communication error (not shown).

Meanwhile, when determined that transmission and reception of the wireless data are correctly performed, the wireless IC 32 acquires the data unit from the wireless data and transmits the data unit to the monitoring IC 31 (step S113). Upon receiving the data unit from the wireless IC 32, the monitoring IC 31 performs various types of inspections based on the inspection data in the data unit and analyzes (inspects) whether transmission and reception of the data unit are correctly performed (step S114). For example, when the cyclic redundancy check is performed, the monitoring IC 31 may calculate the CRC data from the message data and determine whether the CRC data coincides with the received CRC data.

When determined that transmission and reception of the data unit are not correctly performed, the monitoring IC 31 performs a process based on the communication error (not shown). Meanwhile, when determined that the data unit is correctly received, the monitoring IC 31 retrieves the acquisition instruction command from the data unit and acquires the battery information from the battery cell 22 based on the acquisition instruction command (step S115). Then, the monitoring IC 31 converts the acquired battery information to electronic data and generates the message data. In addition, the monitoring IC 31 also generates the inspection data based on the inspection method that is performed (step S116). For example, when the cyclic redundancy check is performed, the CRC data may be generated from the message data that includes the battery information and included in the generated inspection data as described above. In a similar manner, when the ID check is performed, the ID number of the monitoring IC 31 is included in the generated inspection data. Furthermore, when the sequence check and the timeout check are performed, the sequence number is included in the generated inspection data.

Then, the monitoring IC 31 generates a data unit from the message data and the inspection data and transmits the data unit to the wireless IC 32 (step S117). As shown in FIG. 14, upon receiving the data unit from the monitoring IC 31, the wireless IC 32 adds the communication control information and the communication protection data to the data unit, and generates wireless data (step S121). The communication protection data is generated based on the inspection method that is performed.

Then, the wireless IC 32 transmits the generated wireless data through the wireless antenna 33 (step S122). Upon receiving the wireless data through the wireless antenna 43, the wireless IC 42 that serves as the reception side confirms (determines) whether the wireless data is wireless data that is addressed to the wireless IC 42 itself based on the communication control information in the wireless data (step S123). When the wireless data is not wireless data that is addressed to the wireless IC 42 itself, the process is ended.

When determined that the wireless data is wireless data that is addressed to the wireless IC 42 itself, the wireless IC 42 inspects the received communication control information based on the communication protection data in the received wireless data and analyzes (inspects) whether transmission and reception of the wireless data are correctly performed (step S124). When transmission and reception of the wireless data are not correctly performed, the wireless IC 42 performs a process based on the communication error (not shown).

Meanwhile, when determined that the wireless data is correctly received, the wireless IC 42 acquires the data unit from the wireless data and transmits the data unit to the battery control MCU 41 (step S125). Upon receiving the data unit from the wireless IC 42, the battery control MCU 41 performs various types of inspections based on the inspection data in the data unit, and analyzes (inspects) whether transmission and reception of the data unit are correctly performed (step S126). For example, when the cyclic redundancy check is performed, the CRC data may be generated as described above from the received message data and compared with the CRC data that is included in the inspection data. In a similar manner, when the ID check is performed, inquiry of the ID number that is included in the inspection data is performed. Furthermore, when the sequence check is performed, whether the sequence number follows the communication schedule 900 is determined. Moreover, when the timeout check is performed, whether data is transmitted and received within an amount of time that is prescribed by the communication schedule 900 is determined.

When transmission and reception of the data unit are not correctly performed, the monitoring IC 31 performs a process based on the communication error (not shown). Meanwhile, when determined that the data unit is correctly received, the battery control MCU 41 retrieves the battery information from the data unit and performs various processes based on the battery information (step S127).

Hereafter, as a result of the configuration according to the first embodiment, advantageous effects such as those below can be achieved.

A transmissive portion, such as the seal member 54, the explosion-proof valve 55, and the service plug SP 56, that allows transmission of radio waves is provided in a portion of the housing 50. Therefore, effects of radio waves from outside the housing 50 on wireless communication are a concern. However, the battery monitoring apparatus 30 and the battery control apparatus 40 that are housed in the housing 50 are provided with the protection mechanisms 38 and 48 for protecting the battery information during wireless communication. Therefore, wireless communication can be appropriately performed without receiving the effects of radio waves from outside the housing 50.

In addition, the protection mechanisms 38 and 48 are respectively provided in the monitoring IC 31 and the battery control MCU 41. Furthermore, the battery information is protected by the protection mechanisms 38 and 48 on the transmission side and the reception side cooperatively inspecting in the communication layer that is between the monitoring IC 31 and the battery control MCU 41. Consequently, the data unit can be protected between the monitoring IC 31 and the battery control MCU 41, without taking into consideration a configuration of a communication layer between the wireless IC 32 on the monitoring side and the wireless IC 42 on the control side. That is, design can be independently performed for each communication layer, thereby facilitating design.

When the battery information is transmitted, the protection mechanism 38 of the monitoring IC 31 generates the CRC data (error detection code) for detecting an error in the battery information based on the battery information and includes the CRC data in the inspection data to be transmitted. The protection mechanism 48 of the battery control MCU 41 examines whether an error is present in the received battery information based on the error detection code in the received data unit. That is, the cyclic redundancy check is performed. Consequently, an error in the battery information of which a probability of occurrence increases as a result of the effects of external radio waves in wireless communication can be inspected. In addition, when wireless communication is performed, compared to a case in which the CRC data is generated for all pieces of transmitted wireless data, redundancy of wireless data can be suppressed in the case according to the present embodiment in which only the message data is subject thereto.

When the battery information is transmitted, the protection mechanism 38 of the monitoring IC 31 acquires identification information (ID number) of the transmission source and includes the identification information in the inspection data. The protection mechanism 48 of the battery control MCU 41 inspects whether the transmission source is correct based on the ID number that is included in the received data unit. That is, the ID check is performed. Consequently, when wireless communication is performed, an error in the transmission source of which a probability of occurrence increases as a result of the effects of external radio waves in wireless communication can be confirmed.

When the battery information is transmitted, the protection mechanism 38 of the monitoring IC 31 generates order information (sequence number) and includes the order information in the inspection data. Then, the monitoring IC 31 transmits the data unit at a transmission timing that is prescribed based on the communication schedule 900. The protection mechanism 48 of the battery control MCU 41 inspects whether the data unit is received at the reception timing that is prescribed based on the communication schedule 900, based on the sequence number that is included in the received data unit. That is, the sequence check and the timeout check are performed. Consequently, when wireless communication is performed, presence/absence of an error in the order of transmission, a missed transmission, a transmission delay, and the like of which a probability of occurrence increases as a result of the effects of external radio waves in wireless communication can be confirmed.

Inspection is performed even in the communication layer between the wireless IC 32 on the monitoring side and the wireless IC 42 on the control side. Therefore, inspection is doubly performed in the communication layer that is between the monitoring IC 31 and the battery control MCU 41, and the communication layer that is between the wireless IC 32 on the monitoring side and the wireless IC 42 on the control side. As a result, the battery information can be more reliably sent. In addition, the communication protection data that is added between the wireless ICs 32 and 42 is for inspecting and protecting the communication control information. Therefore, compared to a case in which the battery information is also protected, redundancy of wireless data can be suppressed. Consequently, power consumption can be suppressed.

Furthermore, the communication control information is transmitted before the data unit that includes the battery information, and whether an error is present in the communication control information is examined. In addition, when an error is detected in the communication control information, a determination can, of course, be made that an error is highly likely to also be present in the data unit that is subsequently received. Consequently, compared to a case in which the communication control information is transmitted after the data unit, the data unit can be more accurately transmitted when the communication control information is transmitted before the data unit.

When wireless communication is performed, compared to wired communication, address error, missing data, data error, delayed data, and the like are more likely to occur as a result of the effects of external radio waves of the housing 50 and the like. Therefore, any or all of the inspections among the cyclic redundancy check, the ID check, the sequence check, and the timeout check are performed. That is, any or all of the sequence number, the ID number, and the CRC data (error detection code) are added to the inspection data in the data unit. Consequently, communication errors that tend to occur in wireless communication can be suppressed.

In the case of wireless communication, communication speed is often slower and communication frequency is often lower, compared to wired communication. Therefore, in a case in which an abnormality occurs in a temperature or a voltage of the battery cell 22, or an abnormality is detected as a result of the self-diagnosis information, a value may suddenly change if a communication error occurs. In addition, when a value suddenly changes, control may suddenly change as a result, and operability may be affected even though safety is not an issue. Therefore, at least any of the temperature information, the voltage information, and the self-diagnosis information of the battery cell 22 is included in the battery information to be protected. Consequently, communication errors can be suppressed and effects on operability can be suppressed.

As shown in FIG. 2, FIG. 3, and FIG. 5, in a direction (Z direction) orthogonal to the housing cover 52 in which the explosion-proof valve 55 is provided, the explosion-proof valve 55 overlaps the path that linearly connects the wireless antenna 33 of the battery monitoring apparatus 30 and the wireless antenna 43 of the battery control apparatus 40. As a result of such a configuration, the wireless antennas 33 and 43 tend to be affected by radio waves from outside the housing 50. Therefore, wireless communication can be reliably performed as a result of the protection mechanisms 38 and 38 being provided.

In general, from the installation surface 51 located in the vehicle 10, radio waves are blocked by the vehicle body and do not easily infiltrate from outside. Meanwhile, surfaces other than the installation surface 51 of the housing 50, such as the housing cover 52 that opposes the installation surface 51 and the side surface 53, are often exposed outside. In addition, in terms of safety or maintenance, such surfaces may be required to be provided with transmissive portions such as the explosion-proof valve 55, the seal member 54, and the service plug SP 56. Therefore, radio waves from outside the housing 50 tend to infiltrate the surface on which the transmissive portion is provided. In addition, either of the wireless antennas 33 and 43 is exposed to the surface on which the transmissive portion is provided. In this case, the effects of external radio waves are easily received and interference in wireless communication easily occurs. Therefore, whether data is correctly transmitted and received can be inspected, and wireless communication can be reliably performed as a result of the protection mechanisms 38 and 48 being provided in the battery monitoring apparatus 30 and the battery control apparatus 40 that include the wireless antennas 33 and 43.

When an obstruction is arranged between the wireless antennas 33 and 43, wireless communication is performed using reflected waves. However, when a transmissive portion is provided in the housing 50, depending on the arrangement of the wireless antennas 33 and 43, the reflected waves may not be favorably received as a result of the transmissive portion. Therefore, as shown in FIG. 5, the wireless antennas 33 and 43 that are included in the battery monitoring apparatus 30 and the battery control apparatus 40 are arranged in an opposing manner so as to be capable of transmitting and receiving direct waves Rd. That is, the wireless antennas 33 and 43 are arranged so as to protrude further than the battery cells 22 and the like in the Z direction. A conductive obstacle or the like that obstructs radio waves is not arranged between the wireless antennas 33 and 43. Consequently, the direct wave Rd that has a stronger propagation strength that the reflected wave can be transmitted and received, and communication can be reliably performed.

Here, when the wireless antennas 33 and 43 are arranged in an opposing manner, because the direct waves Rd can be transmitted and received, communication failure should inherently be fewer compared to a case in which wireless communication is performed through reflected waves. However, in a case in which the transmissive portion such as the explosion-proof valve 55 is provided in the housing cover 52 or the side surface 53, wireless communication may be obstructed by radio waves from outside. Therefore, wireless communication can be reliably performed as a result of the protection mechanisms 38 and 48 being provided.

The transmissive portion is the explosion-proof valve 55 for releasing gas inside the housing 50, the service plug SP 56 for disconnecting electrical connection between a circuit and the assembled battery 20, or the seal member 54 that seals a gap in the housing 50. In terms of structure, these members are difficult to configure to block radio waves. In addition, in terms of safety or maintenance, positions in which these members are provided are determined to a certain extent. Depending on the arrangement of the wireless antennas 33 and 43, these members may be easily affected by radio waves from outside. Therefore, the battery information can be reliably transmitted and received as a result of the protection mechanisms 38 and 48 being provided.

The battery control MCU 41 instructs acquisition and return of the battery information, and the monitoring IC 31 performs acquisition and transmission of the battery information in response thereto. As a result, each monitoring IC 31 is not required to manage and ascertain the communication schedule 900. In addition, as a result of the battery control MCU 41 unitarily managing the communication schedule 900, management and modification of the communication schedule 900 can be easily performed. Furthermore, control in the monitoring IC 31 can be facilitated.

OTHER EMBODIMENTS

A portion of the configuration according to the first embodiment may be modified as according to embodiments described below. Hereafter, the first embodiment is described as a basic configuration. Configurations similar to those according to the first embodiment are given the same reference numbers. Descriptions thereof are omitted.

According to the above-described embodiment, all pieces of battery information are protected by the protection mechanisms 38 and 48. However, the battery information may be selectively protected. At this time, information that is protected may be selected based on a level of importance or and environment.

For example, the temperature of the battery cell 22 generally does not easily change compared to the voltage and the SOC. Therefore, compared to the voltage information and the SOC, the temperature information being less frequently updated can be said to not be an issue. Therefore, of the battery information, only information, such as the voltage information and the SOC, that has a higher need for frequent updates may be protected and information, such as the temperature information, that has a lower need for frequent updates may not be protected. In addition, for example, the temperature information may be protected in cases in which the temperature of the vehicle 10 increases and the environment is such that the temperature of the battery cell 22 easily increases.

According to the above-described embodiment, the protection mechanism 38 is provided in all of the monitoring ICs 31 of the battery monitoring apparatuses 30. However, the protection mechanism 38 may be provided in only some of the monitoring ICs 31. That is, the protection mechanism 38 is merely required to be provided in at least the battery monitoring apparatus 30 that is easily affected by the radio waves from outside.

For example, according to the first embodiment, a transmissive portion such as the explosion-proof valve 55 may not be arranged so as to overlap in the Z direction on a linear path that connects the battery monitoring apparatus 30 that is closest to the battery control apparatus 40 (the battery monitoring apparatus 30 that is closest to the battery control apparatus 40 in the X direction) in FIG. 2 and the battery control apparatus 40. In a similar manner, on this linear path, a transmissive portion is also not arranged so as to overlap in the X direction or the Y direction. Therefore, wireless communication between the battery monitoring apparatus 30 that is closest to the battery control apparatus 40 in FIG. 2 and the battery control apparatus 40 is thought to not easily be affected by the radio waves from outside. Consequently, the protection mechanism 38 may not be provided in the battery monitoring apparatus 30 that is closest to the battery control apparatus 40 in FIG. 2.

Meanwhile, a transmissive portion such as the explosion-proof valve 55 is arranged so as to overlap in the Z direction on a linear path that connects another battery monitoring apparatus 30 and the battery control apparatus 40. In addition, a distance is also far. Therefore, wireless communication between the other battery monitoring apparatus 30 and the battery control apparatus 40 is considered to be easily affected by the radio waves from outside. Consequently, the protection mechanism 38 being provided in the monitoring ICs 31 of other battery monitoring apparatuses 30 excluding the battery monitoring apparatus 30 that is closest to the battery control apparatus 40 in FIG. 2 can be considered preferable.

According to the above-described embodiment, the battery monitoring apparatus 30 is provided for each battery block 21. However, a single battery monitoring apparatus 30 may be provided for a plurality of battery blocks 21. Alternatively, a plurality of battery monitoring apparatuses 30 may be provided for a single battery block 21.

According to the above-described embodiment, a single monitoring IC 31 is provided for each battery monitoring apparatus 30. However, a plurality of monitoring ICs 31 may be provided. In this case, the wireless IC 32 may be provided for each monitoring IC 31. Alternatively, a single wireless IC 32 may be provided for a plurality of monitoring ICs 31. Here, when a single wireless IC 32 is provided for a plurality of monitoring ICs 31, the wireless IC 32 may separately transmit the battery information that is received from each monitoring IC 31 or may collectively transmit a plurality of sets of battery information.

According to the above-described embodiment, a single monitoring IC 31 is provided for a plurality of battery cells 22. However, a single monitoring IC 31 may be provided for a single battery cell 22.

According to the above-described embodiment, the monitoring IC 31 collectively transmits the sets of battery information of the battery cells 22 that configure the battery block 21 to be monitored. However, the monitoring IC 31 may be configured to be capable of separately transmitting the sets of battery information for each battery cell 22. In addition, the monitoring IC 31 may be configured to be capable of selecting and transmitting some of the sets of battery information of the battery cells 22 that configure the battery block 21 to be monitored. For example, in a manner similar to that described above, the information of the battery cell 22 to be transmitted may be selected based on the level of importance or the environment.

According to the above-described embodiment, the monitoring IC 31 protects all sets of battery information of the battery cells 22 that configure the battery block 21 to be monitored. However, the monitoring IC 31 may select the set of battery information to be protected. For example, in a manner similar to that described above, the information of the battery cell 22 to be protected may be selected based on the level of importance or the environment.

According to the above-described embodiment, a plurality of battery control apparatuses 40 may be provided.

According to the above-described embodiment, wireless communication is not required to be performed with all battery monitoring apparatuses 30. Wired communication may be performed for some battery monitoring apparatuses 30. For example, in a case in which an environment for wireless communication is poor, such as when the distance between the battery monitoring apparatus 30 and the battery control apparatus 40 is long and a transmissive portion is arranged therebetween, connection may be made such that wired communication is performed.

According to the above-described embodiment, the protection mechanism 38 that protects the battery information is provided in the monitoring IC. However, the protection mechanism 38 may be provided in the wireless IC.

According to the above-described embodiment, the wireless ICs 32 and 42 inspect and protect wireless control information. However, the message data that is included in the battery information may be similarly inspected and protected. In addition, the data unit may also be similarly inspected and protected. Consequently, the battery information can be more reliably transmitted and received.

According to the above-described embodiment, the wireless ICs 32 and 42 may perform the timeout check on the wireless data therebetween. At this time, the amount of time in which time out occurs in the time from transmission to reception may differ from that of the timeout check that is performed between the monitoring IC 31 and the battery control MCU 41. Specifically, the amount of time in which timeout occurs in the communication between the wireless ICs 32 and 42 may be shorter than that in the communication between the monitoring IC 31 and the battery control MCU 41.

That is, the timeout check between the wireless ICs 32 and 42 is mainly to ensure reliability of the wireless data, such as by detecting that the wireless data is correct and not delayed, and retransmitting the wireless data. Therefore, the check is preferably performed each time the wireless data is transmitted and received. Meanwhile, the battery information is merely required to be correctly transmitted and received from occurrence of an abnormality until a dangerous state is reached, and has more leeway compared to the communication between the wireless ICs 32 and 42. Therefore, the amount of time in which timeout occurs in the communication between the monitoring IC 31 and the battery control MCU 41 may be longer compared to the amount of time in which timeout occurs in the communication between the wireless ICs 32 and 42.

According to the above-described embodiment, the wireless ICs 32 and 42 may perform the ID check of the wireless ICs 32 and 42 therebetween. At this time, a frequency (cycle) at which the ID numbers of the wireless ICs 32 and 42 are checked may differ from that of the ID check performed between the monitoring IC 31 and the battery control MCU 41. Specifically, the cycle at which the ID check is performed in the communication between the wireless ICs 32 and 42 may be shorter compared to a cycle at which the ID check is performed between the monitoring IC 31 and the battery control MCU 41.

That is, the ID check between the wireless ICs 32 and 42 is mainly to ensure reliability of the wireless data, such as by detecting that the transmission source of the wireless data is correct and crossed lines have not occurred. Therefore, the check is preferably performed each time the wireless data is transmitted and received. Meanwhile, the battery information is merely required to be correctly transmitted and received from occurrence of an abnormality until a dangerous state is reached, and has more leeway compared to the communication between the wireless ICs 32 and 42. Therefore, the cycle at which the ID check is performed in the communication between the monitoring IC 31 and the battery control MCU 41 may be longer compared to the cycle at which the ID check is performed in the communication between the wireless ICs 32 and 42. Consequently, the ID number can be omitted and a data amount of the wireless data can be reduced.

According to the above-described embodiment, the wireless ICs 32 and 42 may perform the cyclic redundancy check (CRC) of the wireless data therebetween. At this time, the data unit is not required to be checked, and the CRC may be performed only on the communication control information. Of course, the CRC may also be performed between the wireless ICs 32 and 42 so as to include the battery information.

At this time, a frequency (cycle) at which the CRC is performed between the wireless ICs 32 and 42 may differ from an execution cycle of the CRC that is performed between the monitoring IC 31 and the battery control MCU 41. Specifically, compared to the cycle at which the CRC is performed between the monitoring IC 31 and the battery control MCU 41, the cycle at which the CRC is performed between the wireless ICs 32 and 42 may be shorter.

That is, the CRC between the wireless ICs 32 and 42 is mainly to ensure reliability of the wireless data, such as by detecting that content of the wireless data is correct and has no error. Therefore, the check is preferably performed each time the wireless data is transmitted and received. Meanwhile, the battery information is merely required to be correctly transmitted and received from occurrence of an abnormality until a dangerous state is reached, and has more leeway compared to the communication between the wireless ICs 32 and 42. Therefore, the cycle at which the CRC is performed in the communication between the monitoring IC 31 and the battery control MCU 41 may be longer compared to the cycle at which the CRC is performed between the wireless ICs 32 and 42. As a result, the CRC data can be omitted and the data amount of the wireless data can be reduced.

According to the above-described embodiment, the wireless ICs 32 and 42 may perform the sequence check of wireless data therebetween. At this time, the frequency (cycle) at which the sequence check is performed between the wireless ICs 32 and 42 may differ from the execution frequency of the sequence check performed between the monitoring IC 31 and the battery control MCU 41. Specifically, the cycle at which the sequence check is performed in the communication between the wireless ICs 32 and 42 may be shorter compared to the cycle at which the sequence check is performed between the monitoring IC 31 and the battery control MCU 41.

That is, the sequence check between the wireless ICs 32 and 42 is mainly to ensure reliability of the wireless data, such as by detecting that data delay and missing data have not occurred in the wireless data. Therefore, the check is preferably performed each time the wireless data is transmitted and received. Meanwhile, the battery information is merely required to be correctly transmitted and received from occurrence of an abnormality until a dangerous state is reached, and has more leeway compared to the communication between the wireless ICs 32 and 42. Therefore, the cycle at which the sequence check is performed in the communication between the monitoring IC 31 and the battery control MCU 41 may be longer compared to the cycle at which the sequence check is performed in the communication between the wireless ICs 32 and 42. Consequently, the sequence number can be omitted and the data amount of the wireless data can be reduced.

According to the above-described embodiment, a thin portion in which a thickness dimension is thinner that that of other portions may be provided in a part of the housing 50. In addition, the thin portion may be the transmissive portion that allows transmission of radio waves. As a result of the thin portion being provided, the housing 50 can be reduced in weight. However, in terms of structure, the thin portion easily transmits radio waves. In addition, in terms of strength of the housing 50, a position in which the thin portion can be formed is determined to a certain extent. Therefore, depending on the arrangement of the wireless antennas 33 and 43, the effects of external radio waves may be easily received. Therefore, in the housing 50 that is provided with the thin portion, enabling the battery information to be reliably transmitted and received as a result of the protection mechanisms 38 and 48 being provided is required.

According to the above-described embodiment, the housing 50 may be partially or entirely composed of resin. In addition, the portion that is composed of resin may be the transmissive portion that allows transmission of radio waves. As a result of the housing 50 being composed of resin, the housing 50 can be reduced in weight. However, when the housing 50 is composed of resin, radio waves are easily transmitted. Furthermore, to achieve reduced weight, a large portion of the housing 50 is preferably composed of resin. Therefore, the effects of external radio waves are easily received. Therefore, in the housing 50 that is composed of resin, enabling the battery information to be reliably transmitted and received as a result of the protection mechanisms 38 and 48 being provided is required.

According to the above-described embodiment, the inspection is also performed in the communication layer between the wireless IC 32 and the wireless IC 42. However, if the inspection of the data unit is performed between the monitoring IC 31 and the battery control MCU 41, the inspection in the communication layer between the wireless IC 32 and the wireless IC 42 may not be performed.

According to the above-described embodiment, the inspection of the communication control information is performed between the wireless IC 32 and the wireless IC 42. However, in addition to only the communication control information, the communication control information and the data unit may be inspected together. Consequently, wireless communication can be more reliably performed.

According to the above-described embodiment, errors in the message data that includes the battery information, commands, and the like are detected by the cyclic redundancy check (CRC). However, other detection methods may be used. For example, parity check, check sum, or hash, may be used. Moreover, in addition to only error detection, an error may be corrected after the error is detected through use of an error detection correction code.

According to the above-described embodiment, the sequence number is included in the inspection data, and the sequence check and the timeout check are performed based on the sequence number. As another example, time information such as a transmission time or a time stamp may be included in the inspection data, and the sequence check and the timeout check may be performed based on the time information.

According to the above-described embodiment, the battery control MCU 41 instructs acquisition and return of the battery information, and the monitoring IC 31 performs acquisition and transmission of the battery information in response thereto. As another example, the monitoring IC 31 may acquire and transmit the battery information at a transmission timing that is determined in advance based on a communication schedule that is determined in advance. In this case, the battery control MCU 41 may store a same communication schedule as that on the transmission side and inspect whether the battery information is received at a reception timing that is determined in advance based on the communication schedule. Consequently, an amount of communication can be reduced and a likelihood of a communication error occurring can be reduced.

According to the above-described embodiment, the wireless antennas 33 and 43 are arranged in an opposing manner inside the housing 50 so as to be capable of transmitting and receiving direct waves Rd. As another embodiment, the arrangement of the wireless antennas 33 and 43 may be arbitrarily modified. For example, a shield that blocks radio waves of the battery cells 22 and the like may be arranged between the wireless antenna 33 and the wireless antenna 43. In this case as well, the reflected waves may be received through use of the housing 50 and the like.

According to the above-described embodiment, a pressure adjustment valve that adjusts air pressure inside the housing 50 may be provided in the housing 50. In addition, the pressure adjustment valve may be a transmissive portion that allows transmission of radio waves.

According to the above-described embodiment, the protection mechanisms 38 and 48 may perform protection by selecting whether to protect (inspect) the battery information based on a state (voltage, SOC, and temperature) of the battery cell 22 to be monitored and the like.

For example, when the voltage, the temperature, or the SOC of the battery cell 22 may be outside a predetermined allowable range, charging and discharging may not be appropriately performed. Therefore, when the voltage, the temperature, or the SOC of the battery cell 22 is near an upper limit value or a lower limit value of the allowable range (within a predetermined range with reference to the upper limit value or the lower limit value), when transmission and reception of the battery information is performed between the monitoring IC 31 that is to monitor the battery cell 22 and the battery control MCU 41, whether the battery information is correctly transmitted and received is preferably inspected and the battery information is preferably protected.

In addition, for example, when the battery information of the battery cell 22 is not received for a predetermined amount of time or greater, when transmission and reception of the battery information is performed between the monitoring IC 31 that is to monitor the battery cell 22 and the battery control MCU 41, whether the battery information is correctly transmitted and received may be preferably inspected and the battery information may be preferably protected.

According to the above-described embodiment, the shape of the housing 50, the arrangement of the battery cells 22, the arrangement of the battery blocks 21, the arrangement of the battery monitoring apparatuses 30, and the arrangement of the battery control apparatus 40 may be arbitrarily modified. At this time, a number, an arrangement, and a shape of the transmissive portion that is the explosion-proof valve 55, the seal member 54, the service plug SP 56, the thin portion, or the portion composed of resin may be arbitrarily modified. For example, the modification may be as shown in FIG. 15 to FIG. 20. Here, in FIG. 15 to FIG. 20, the battery monitoring apparatus 30 is denoted as "CSC" and the battery control apparatus 40 is denoted as "BMU."

Figure 15:
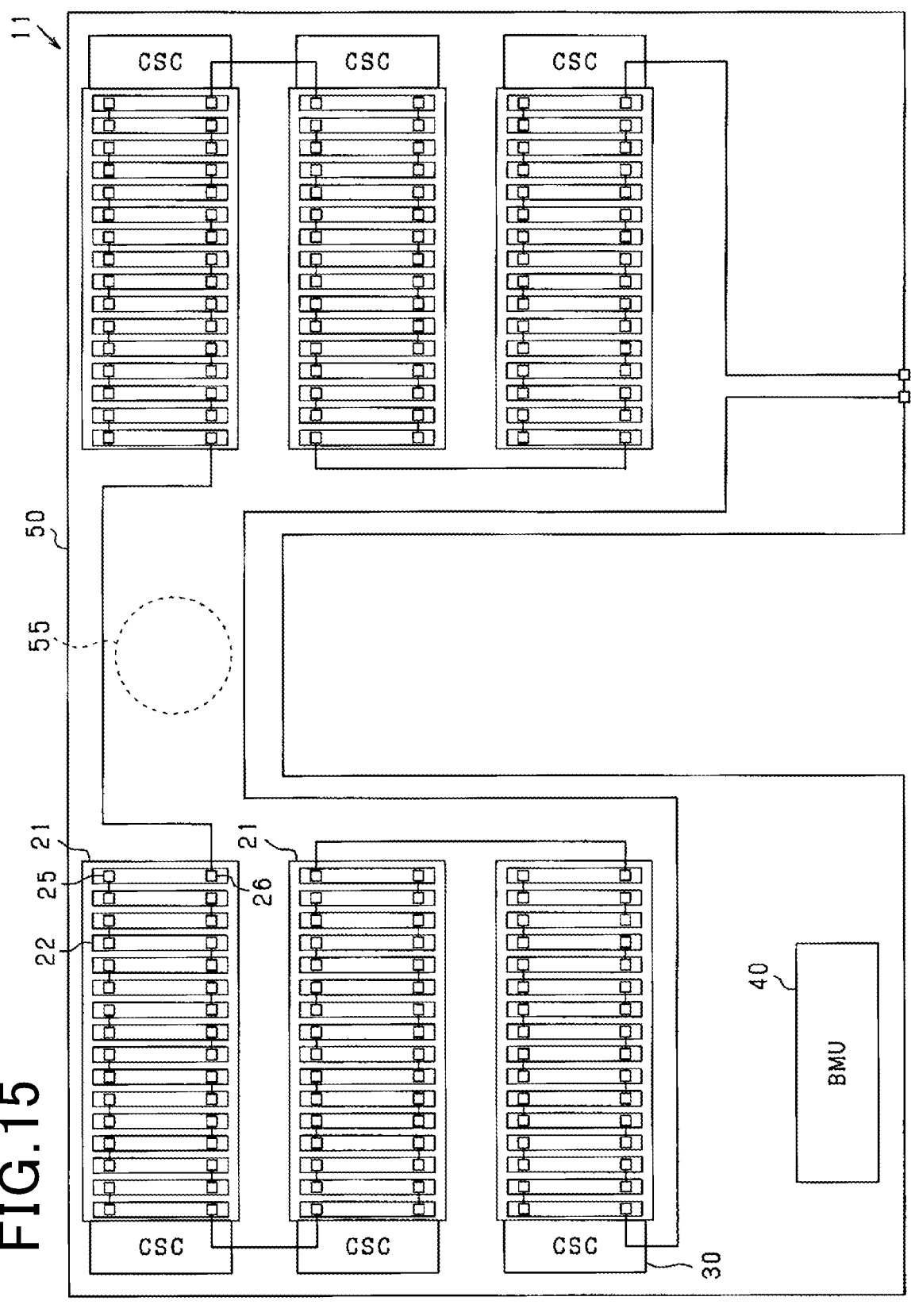
FIG. 15 is a diagram schematically illustrating a battery pack according to another embodiment.

In FIG. 15, the housing 50 that has a C shape from a plan view is used. In FIG. 15, the plurality of battery blocks 21 are arranged so as to be divided into left and right, and the left and right battery blocks 21 are connected by a center portion. In addition, the battery control apparatus 40 is arranged on the left side in FIG. 15. In a configuration such as this, when wireless communication is performed, the battery monitoring apparatus 30 that is arranged on the right side of the housing 50 is basically required to perform wireless communication using reflected waves.

However, when a transmissive portion is provided in the housing 50, for example, when a transmissive portion such as the explosion-proof valve 55 may be provided as shown in FIG. 15 in the center portion through which the reflected wave is thought to pass with certainty, wireless communication may be affected by external radio waves that pass through the transmissive portion. Alternatively, the reflected wave may pass through the transmissive portion and escape outside, thereby affecting wireless communication. Therefore, enabling wireless communication to be reliably performed as a result of the protection mechanisms 38 and 48 being provided as according to the above-described embodiment is preferable.

Here, in FIG. 15, the protection mechanism 38 is preferably at least provided in the battery monitoring apparatus 30 on the right side in which wireless communication is thought to be greatly affected by external radio waves. In addition, although the explosion-proof valve 55 is given as an example as the transmissive portion in FIG. 15, even when another transmissive portions such as the service plug SP 56, the connector 58, or the thin portion is provided, wireless communication may be similarly affected. Furthermore, although the transmissive portion being provided in the center portion is given as an example, because a path by which the reflected wave is transmitted and received is unclear, wireless communication may be affected regardless of the portion of the housing 50 in the transmissive portion is provided.

Figure 16:
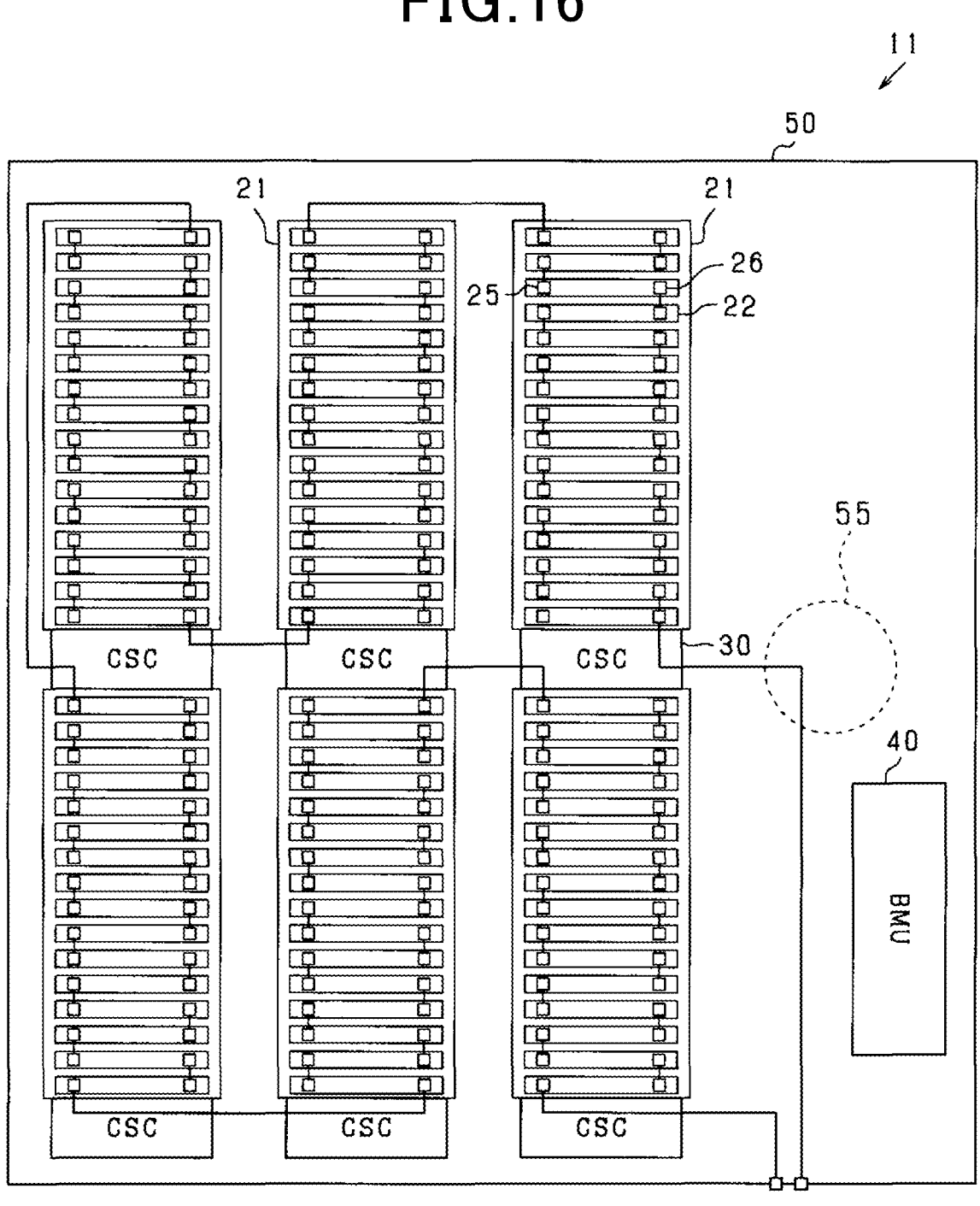
FIG. 16 is a diagram schematically illustrating a battery pack according to another embodiment.

As shown in FIG. 16, the battery monitoring apparatus 30 may be arranged on one end side in the longitudinal direction of each battery block 21. In addition, the battery blocks 21 are not required to be arranged in a row, and may be arranged so as to be divided into left and right. Furthermore, when the transmissive portion such as the explosion-proof valve 55 is provided in the center portion of the housing 50, the transmissive portion is arranged on a path (that is, a transmission path for wireless communication) that linearly connects the battery monitoring apparatus 30 and the battery control apparatus 40 on a right side in FIG. 16. In this case as well, wireless communication may be similarly affected by external radio waves that pass through the transmissive portion.

However, as a result of the protection mechanisms 38 and 48 being provided as according to the above-described embodiment, wireless communication can be reliably performed. Here, in FIG. 16, the protection mechanism 38 is preferably at least provided in the battery monitoring apparatus 30 on the right side in which wireless communication is considered to be greatly affected by external radio waves. Moreover, in FIG. 16, although the explosion-proof valve 55 is given as an example of the transmissive portion, another transmissive portion such as the service plug SP 56 may be provided.

Figure 17:
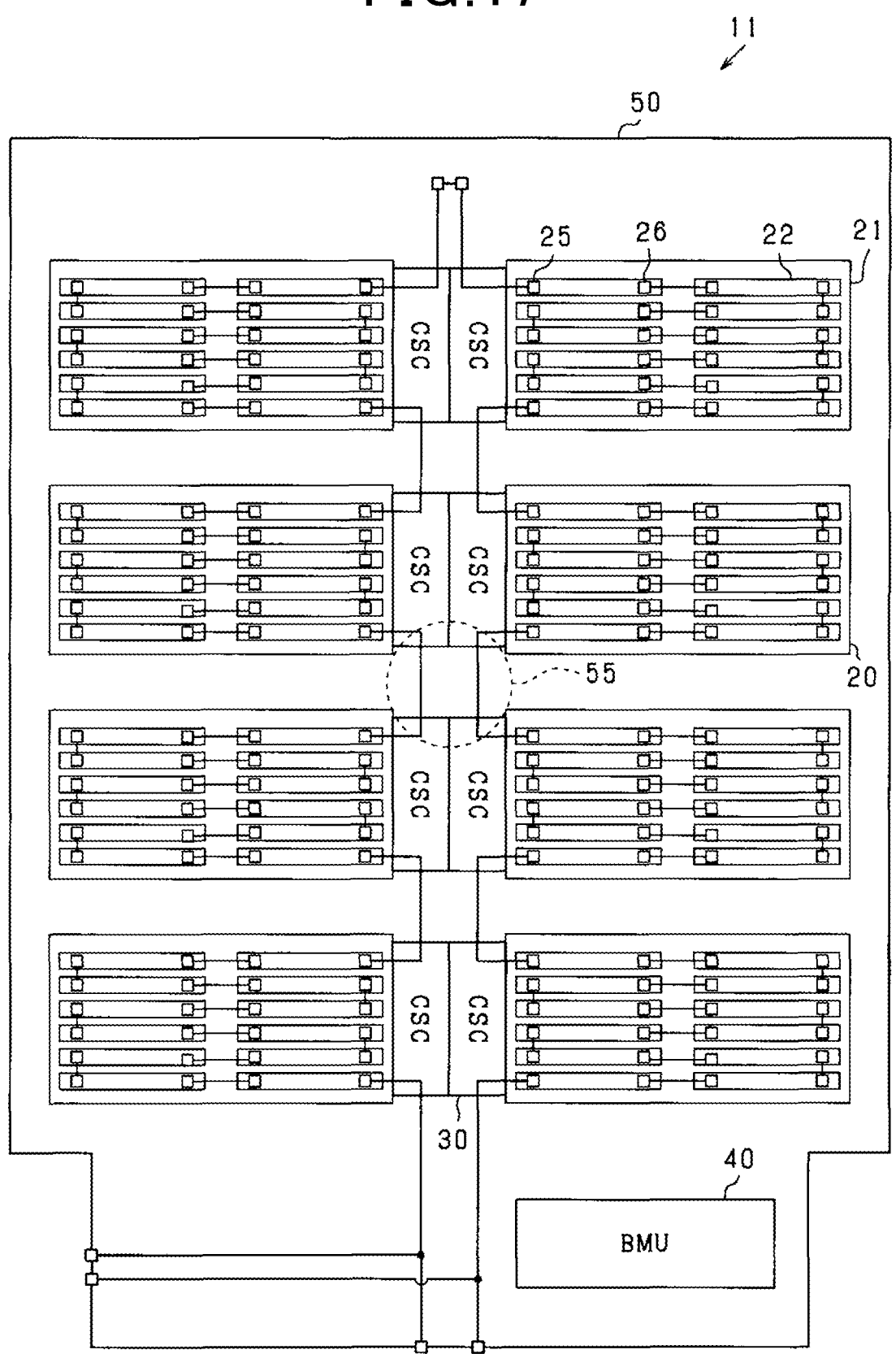
FIG. 17 is a diagram schematically illustrating a battery pack according to another embodiment.

As shown in FIG. 17, the battery monitoring apparatus 30 may be arranged on one end side in the longitudinal direction of each battery blocks 21 and may be arranged so as to be gathered in the center portion of the housing 50. In addition, the battery blocks 21 are not required to be arranged in a row and may be arranged so as to be divided into left and right. Furthermore, in each battery block 21, the battery cells 22 may be arranged so as to be divided into left and right.

In addition, in FIG. 17, when the transmissive portion such as the explosion-proof valve 55 is provided in the center portion of the housing 50, the transmissive portion is arranged on a path (that is, a transmission path for wireless communication) that linearly connects the battery monitoring apparatus 30 and the battery control apparatus 40 on an upper side in FIG. 17. In this case as well, wireless communication may be similarly affected by external radio waves that pass through the transmissive portion. However, as a result of the protection mechanisms 38 and 48 being provided as according to the above-described embodiment, wireless communication can be reliably performed. Here, in FIG. 17, the protection mechanism 38 is preferably at least provided in the battery monitoring apparatus 30 on the upper side in which wireless communication is considered to be greatly affected by external radio waves. Moreover, in FIG. 17, although the explosion-proof valve 55 is given as an example of the transmissive portion, another transmissive portion such as the service plug SP 56 may be provided.

Figure 18:
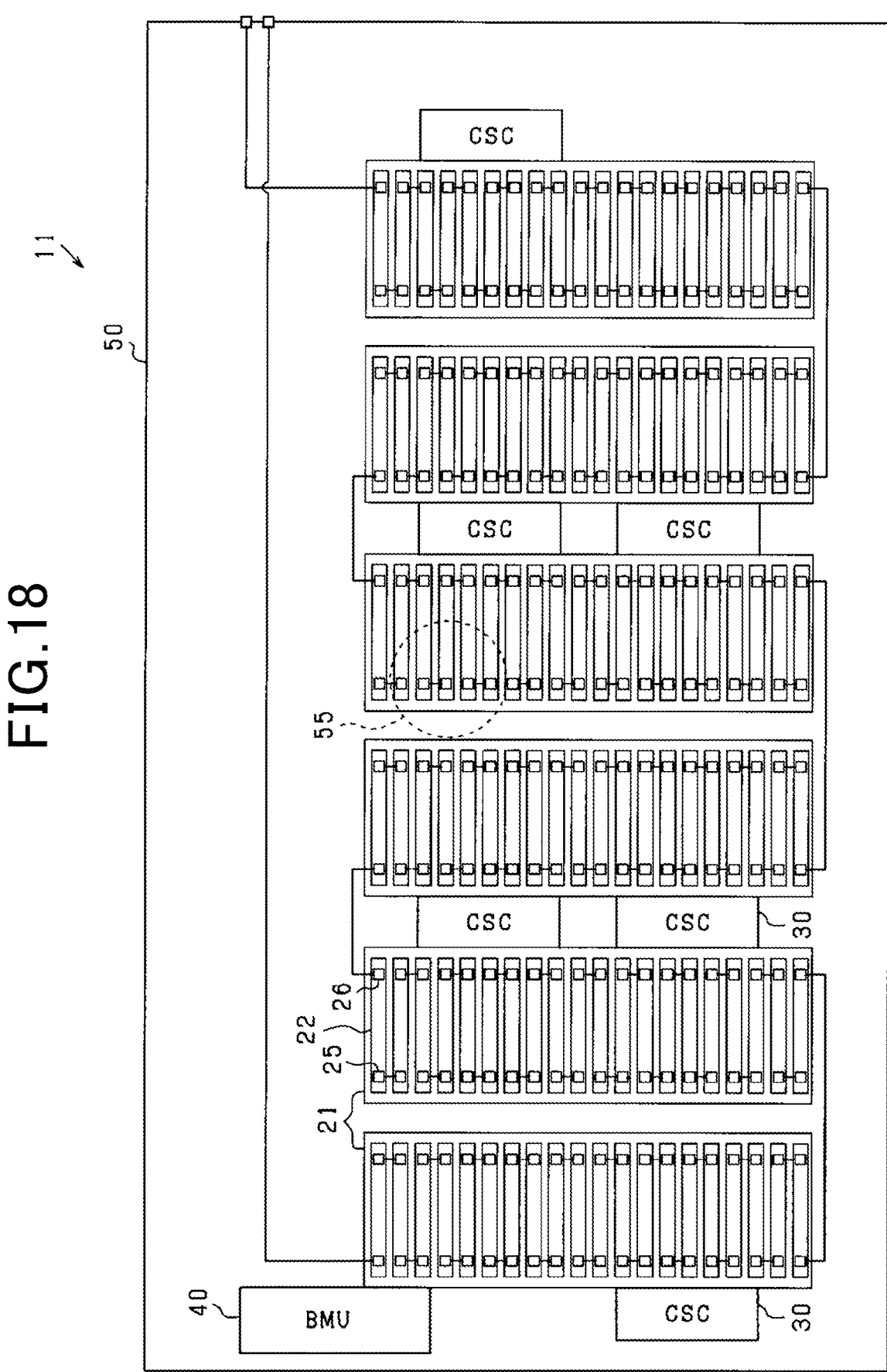
FIG. 18 is a diagram schematically illustrating a battery pack according to another embodiment.

As shown in FIG. 18, the battery monitoring apparatus 30 may be arranged on a side surface in the transverse direction of each battery blocks 21. In addition, the battery monitoring apparatuses 30 may be arranged in an array in the longitudinal direction of each battery block 21. Furthermore, in FIG. 18, when the transmissive portion such as the explosion-proof valve 55 is provided in the center portion of the housing 50, the transmissive portion is arranged on a path (that is, a transmission path for wireless communication) that linearly connects the battery monitoring apparatus 30 and the battery control apparatus 40 on an upper side in FIG. 18. In this case as well, wireless communication may be similarly affected by external radio waves that pass through the transmissive portion.

However, as a result of the protection mechanisms 38 and 48 being provided as according to the above-described embodiment, wireless communication can be reliably performed. Here, in FIG. 18, the protection mechanism 38 is preferably at least provided in the battery monitoring apparatus 30 on the upper side in which wireless communication is considered to be greatly affected by external radio waves. Moreover, in FIG. 18, although the explosion-proof valve 55 is given as an example of the transmissive portion, another transmissive portion such as the service plug SP 56 may be provided.

Figure 19:
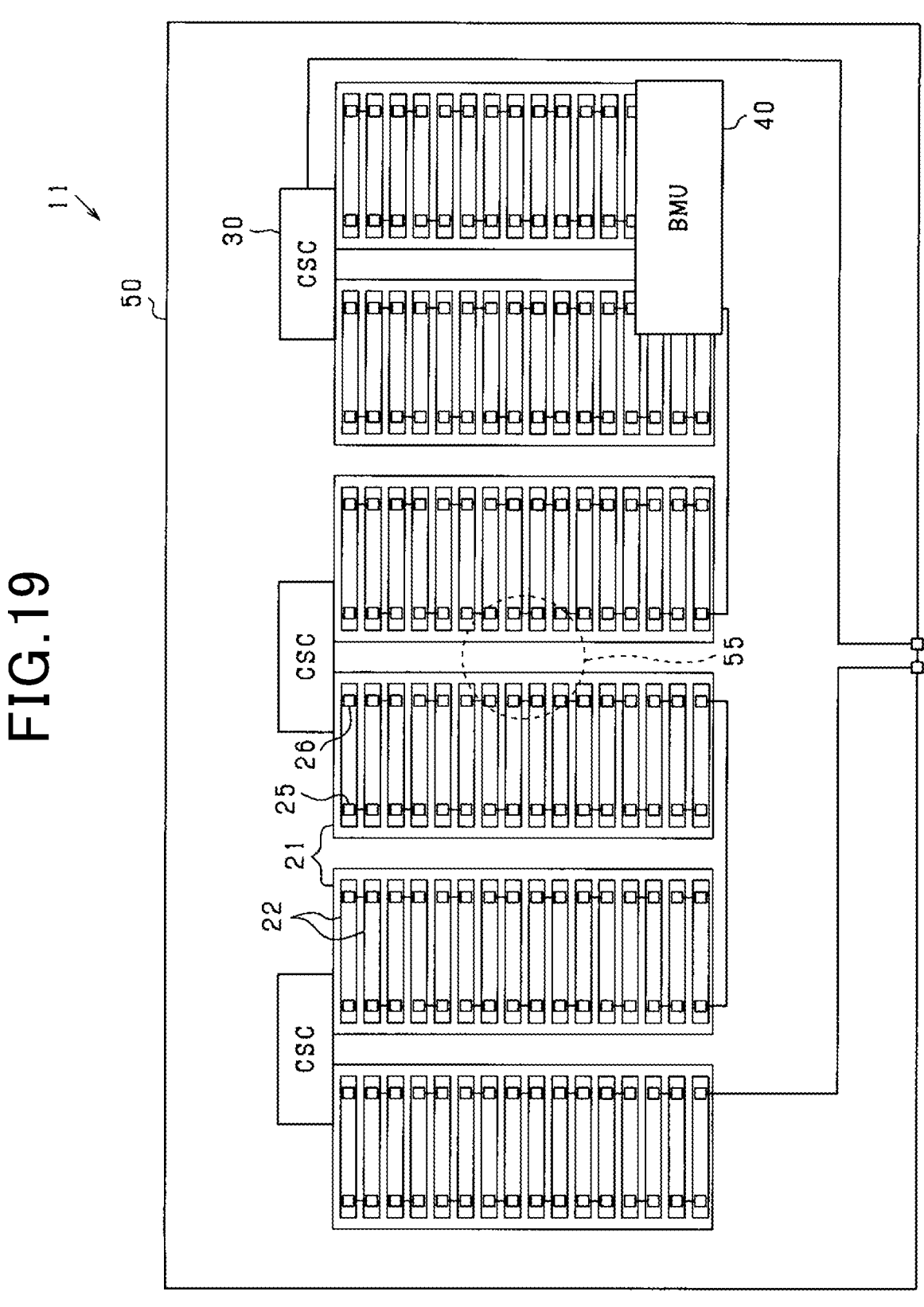
FIG. 19 is a diagram schematically illustrating a battery pack according to another embodiment.

As shown in FIG. 19, a single battery monitoring apparatus 30 may be provided for two battery blocks 21. In addition, in FIG. 19, when the transmissive portion such as the explosion-proof valve 55 is provided in the center portion of the housing 50, the transmissive portion is arranged on a path (that is, a transmission path for wireless communication) that linearly connects the battery monitoring apparatus 30 and the battery control apparatus 40 on a left side in FIG. 19. In this case as well, wireless communication may be similarly affected by external radio waves that pass through the transmissive portion.

However, as a result of the protection mechanisms 38 and 48 being provided as according to the above-described embodiment, wireless communication can be reliably performed. Here, in FIG. 19, the protection mechanism 38 is preferably at least provided in the battery monitoring apparatus 30 on the left side in which wireless communication is considered to be greatly affected by external radio waves. Moreover, in FIG. 19, although the explosion-proof valve 55 is given as an example of the transmissive portion, another transmissive portion such as the service plug SP 56 may be provided.

Figure 20:
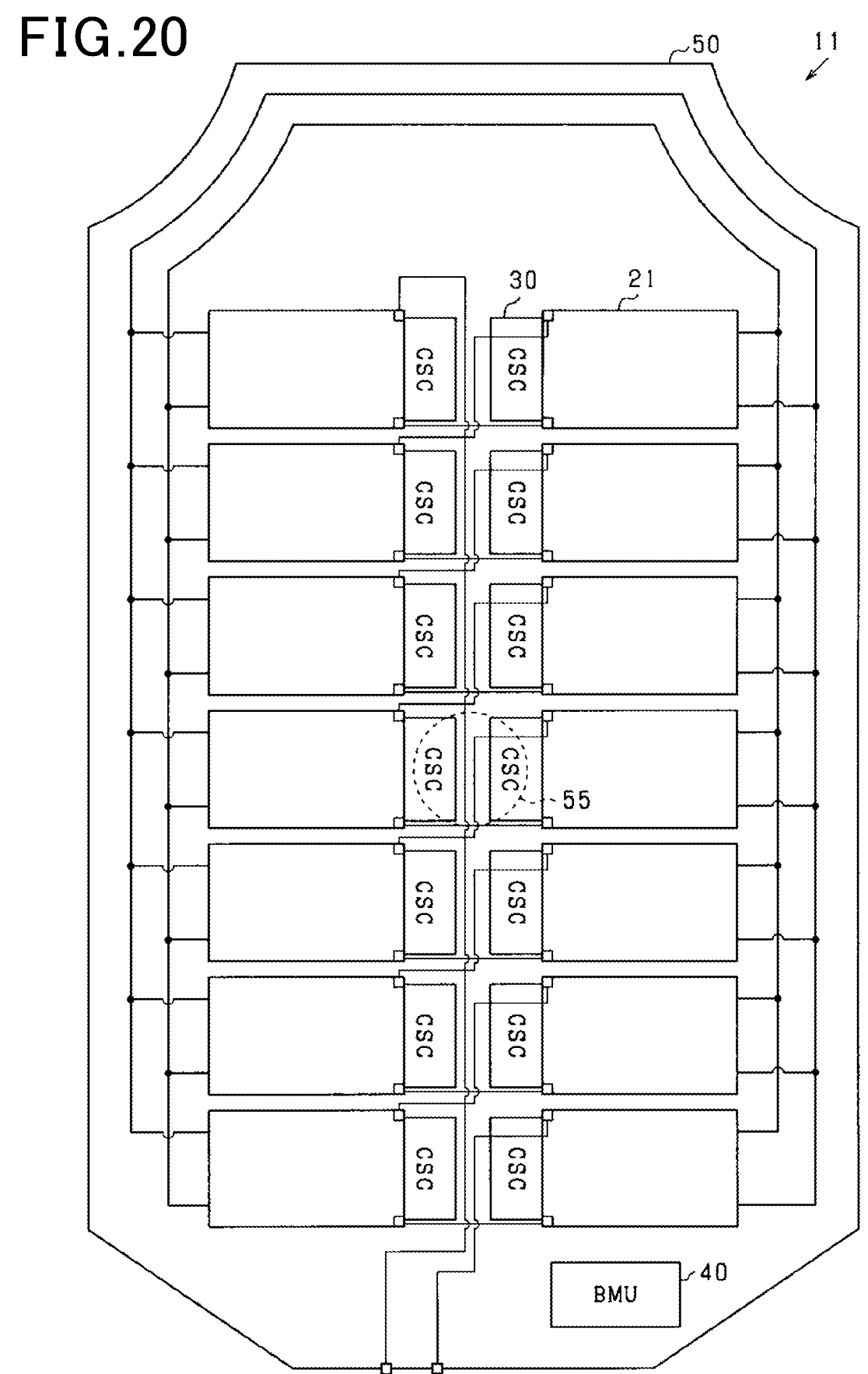
FIG. 20 is a diagram schematically illustrating a battery pack according to another embodiment.

As shown in FIG. 20, the assembled battery 20 may be configured by the battery blocks 21 being connected in parallel. In addition, in FIG. 20, when the transmissive portion such as the explosion-proof valve 55 is provided in the center portion of the housing 50, the transmissive portion is arranged on a path (that is, a transmission path for wireless communication) that linearly connects the battery monitoring apparatus 30 and the battery control apparatus 40 on an upper side in FIG. 20. In this case as well, wireless communication may be similarly affected by external radio waves that pass through the transmissive portion.

However, as a result of the protection mechanisms 38 and 48 being provided as according to the above-described embodiment, wireless communication can be reliably performed. Here, in FIG. 20, the protection mechanism 38 is preferably at least provided in the battery monitoring apparatus 30 on the upper side in which wireless communication is considered to be greatly affected by external radio waves. Moreover, in FIG. 20, although the explosion-proof valve 55 is given as an example of the transmissive portion, another transmissive portion such as the service plug SP 56 may be provided.

Figure 21:
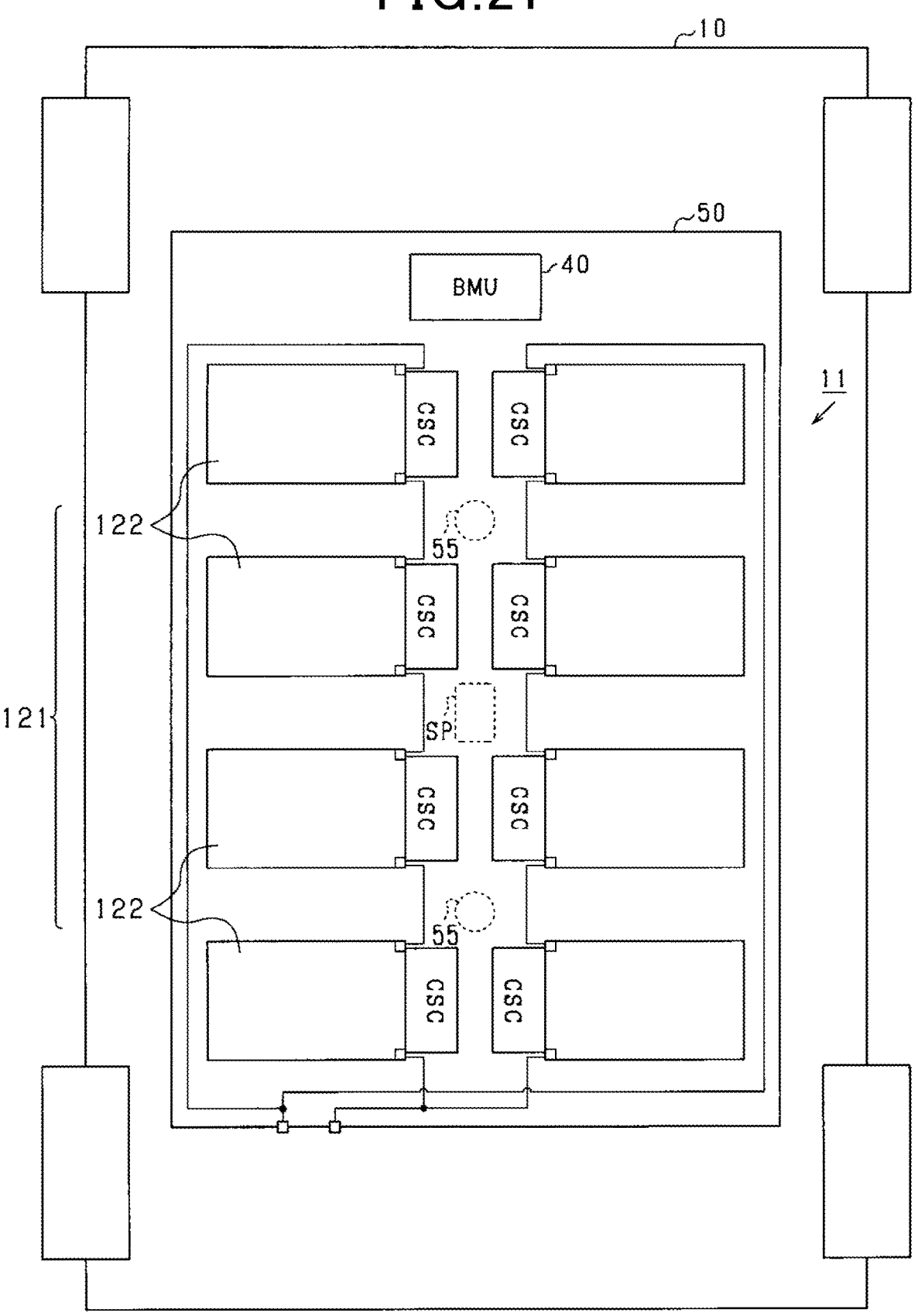
FIG. 21 is a diagram schematically illustrating a battery pack according to another embodiment.

According to the above-described embodiment, as the battery cell 22, a cell that has a laminated structure (referred to hereafter as a laminated-type cell 122) may be used. At this time, the shape of the housing 50, an arrangement of the laminated-type cell 122, an arrangement of a cell stack 121, the arrangement of the battery monitoring apparatus 30, and the arrangement of the battery control apparatus 40 may be arbitrarily modified. Here, the cell stack 121 is configured by a plurality of laminated-type cells 122 being connected and corresponds to the battery block 21. In addition, the number, the arrangement, and the shape of the transmissive portion that is the explosion-proof valve 55, the seal member 54, the service plug Sp 56, the thin portion, or the portion composed of resin may be arbitrarily modified. For example, the configuration may be as shown in FIG. 21 to FIG. 21. Here, in FIG. 21 to FIG. 22, the battery monitoring apparatus 30 is denoted as "CSC" and the battery control apparatus 40 is denoted as "BMU."

More specifically, as shown in FIG. 21, the plurality of laminated-type cells 122 may be arranged in the rectangular housing 50 so as to be arrayed by being separated into two rows on the left and right in the transverse direction of the housing 50. That is, the cell stacks 121 may be arranged so as to be arrayed in two rows. Therefore, in FIG. 21, the plurality of laminated-type cells 122 are arrayed to form a plurality of rows along an array direction (longitudinal direction of the housing 50) that is determined in advance.

In addition, between the laminated-type cells 122 that are divided into the left and right in the transverse direction (on a center side), the battery monitoring apparatus 30 and the battery control apparatus 40 may be arranged. That is, the wireless antennas 33 and 43 of the battery monitoring apparatus 30 and the battery control apparatus 40 may be arranged along the array direction (longitudinal direction of the housing 50) between the plurality of laminated-type cells 122 that are arrayed.

As a result, the battery monitoring apparatus 30 and the battery control apparatus 40 are arranged on a path that is linearly formed along the longitudinal direction (up/down direction in FIG. 21) on the center side in the transverse direction of the housing 50. Consequently, the wireless antennas 33 and 43 can be arranged along the linearly formed path and radio waves can be reliably propagated. That is, the path in the center that is linearly formed serves as a transmission path for wireless communication. Here, in the transverse direction, the transmission path for wireless communication that is formed in the center is surrounded by the left and right cell stacks 121. Therefore, external radio waves can be easily blocked even when a transmissive portion such as the seal member 54 is provided on the side wall of the housing 50.

Here, in FIG. 21, as indicated by broken lines, the service plug SP and the explosion-proof valve 55 are arranged on the transmission path for wireless communication that is formed in the center (on the linear path that connects the battery monitoring apparatus 30 and the battery control apparatus 40). That is, the service plug SP, the explosion-proof valve 55, and the wireless antennas 33 and 43 are arranged so as to form a single row along the longitudinal direction of the housing 50. Therefore, external radio waves may infiltrate through the service plug SP and the explosion-proof valve 55 and hinger wireless communication.

In particular, as shown in FIG. 21, from a perspective of ease of attachment and ease of operation, the service plug SP, the battery monitoring apparatus 30 and the battery control apparatus 40 are arranged on a top surface side of the housing 50. Therefore, the state is such that external radio waves that infiltrate through the service plug SP and the explosion-proof valve 55 easily hinder wireless communication between the battery monitoring apparatus 30 and the battery control apparatus 40. However, as a result of the protection mechanisms 38 and 48 being provided as according to the above-described embodiment, wireless communication can be reliably performed.

Here, the rectangular housing 50 is arranged such that the longitudinal direction runs along the longitudinal direction of the vehicle 10 and the transverse direction runs along the transverse direction of the vehicle 10. However, the housing 50 may be arranged in any manner. In FIG. 21, the housing 50 is assumed to be attached to the vehicle body of the vehicle 10, or specifically, below the seat. In addition, the laminated-type cells 122 may be laminated in the vertical direction.

Figure 22:
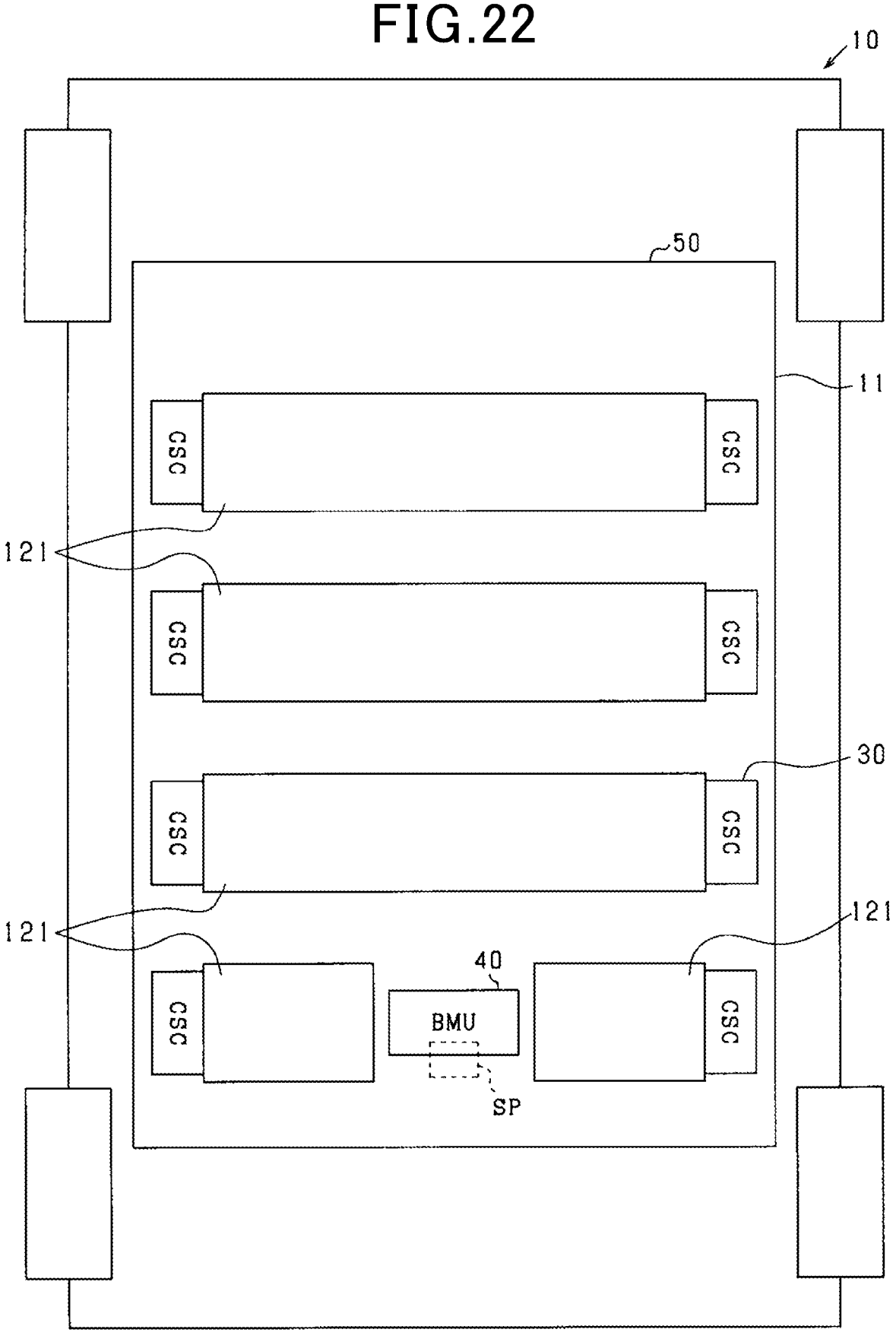
FIG. 22 is a diagram schematically illustrating a battery pack according to another embodiment.

In addition, for example, as shown in FIG. 22, the cell stacks 121 may be arranged in the rectangular housing 50 in an array so as to form a plurality of rows. In addition, the battery control apparatus 40 is arranged on one side in the longitudinal direction of the housing 50. At this time, in the transverse direction of the housing 50, the battery control apparatus 40 is arranged on the center side. Meanwhile, the battery monitoring apparatuses 30 are arranged on both left and right sides that are further outside the cell stacks 121 in the transverse direction.

Furthermore, as indicated by a broken line, the service plug SP is provided on one side in the longitudinal direction of the housing 50 (the battery control apparatus 40 side) on the top surface of the housing 50. In addition, the service plug SP is arranged on the center side in the transverse direction of the housing 50. Therefore, the service plug SP and the battery control apparatus 40 are arranged in close proximity. External radio waves may hinder wireless communication through the service plug SP. However, as a result of the protection mechanisms 38 and 48 being provided as according to the above-described embodiment, wireless communication can be reliably performed.

In addition, the housing 50 shown in FIG. 22 is attached to the vehicle body of the vehicle 10 such that the longitudinal direction runs along the longitudinal direction of the vehicle 10 and the transverse direction runs along the transverse direction of the vehicle 10. More specifically, the battery pack 11 is provided in a lower portion of an interior space in which the seats of the vehicle 10 are provided. In addition, because the service plug SP is provided on the top surface of the housing 50, the service plug SP can be easily reached from inside a vehicle cabin.

Moreover, a propagation space for radio waves used for wireless communication is formed between the top surface of the battery cells 22 and the top surface of the housing 50. That is, the wireless antennas 33 and 43 of the battery control apparatus 40 and the battery monitoring apparatus 30 are arranged so as to protrude further upward than the cell stacks 121 in the vertical direction. Consequently, the cell stacks 121 can be prevented from obstructing wireless communication.

Here, the laminated-type cell 122 that configures the cell stack 121 has a plate-shaped laminated structure and is configured so as to be laminated in the vertical direction. Adjustment of a dimension in the vertical direction is facilitated. Therefore, a height dimension of the battery cell 22 can be easily adjusted such that the top surface of the battery cell 22 does not protrude further than the wireless antennas 33 and 43 in the vertical direction. Consequently, convenience in vehicle-mounting in which mounting restrictions apply can be achieved.

In addition, the battery monitoring apparatus 30 is arranged on an outer peripheral side of the cell stack 121. That is, the battery monitoring apparatus 30 is arranged closer to the side surface 53 of the housing 50 than the cell stack 121 is. Therefore, crosstalk of radio waves therebetween can be mitigated. In addition, as a result of the battery monitoring apparatus 30 being arranged on the outer peripheral side, attachment of the wireless antenna 33 is facilitated. Manufacturing can be efficiently performed. In particular, in the battery pack 11 that has high-voltage wires, as a result of the battery monitoring apparatus 30 being arranged on the outer peripheral side, the wireless antenna can be safely attached. Here, the battery control apparatus 40 may also be similarly arranged on the outer peripheral side of the cell stack 121. Similar effects can be achieved.

Here, in a manner similar to that in FIG. 6, the seal member 54 is formed along an outer periphery of the housing 50. That is, the seal member 54 is provided so as to run along the battery monitoring apparatus 30 and the battery control apparatus 40 that are arranged on the outer peripheral side. Therefore, the seal member 54 is provided near the battery monitoring apparatus 30 and the battery control apparatus 40. The state is such that external radio waves that pass through the seal member 54 easily affect the battery monitoring apparatus 30 and the battery control apparatus 40. However, as a result of the protection mechanisms 38 and 48 being provided as according to the above-described embodiment, wireless communication can be reliably performed.

As a result of the configuration in FIG. 22, because wireless communication is performed between the battery monitoring apparatus 30 and the battery control apparatus 40, a wire harness and the like can be eliminated and size reduction can be achieved. In addition, the height dimension can be easily adjusted through use of the laminate-type cell 122 that has a laminated structure. Consequently, when the battery pack 11 is provided in the lower portion of the interior space in which the seats of the vehicle 10 are provided, the interior space can be made roomier.

Furthermore, when a thin laminated-type cell 122 is used, the battery monitoring apparatus 30 and the battery control apparatus 40 may be arranged above the laminated-type cell 122 in the vertical direction.

According to the above-described embodiment, the vertical direction is the Z direction. However, the Z direction may be arbitrarily changed. For example, a thickness direction of the surface (the housing cover 52 according to the above-described embodiment) on which the transmissive portion (such as the explosion-proof valve 55 according to the above-described embodiment) is provided may be the Z direction. In addition, the X direction and the Y direction may also be arbitrarily changed with reference to the Z direction.

The control unit and the method thereof described in the present disclosure may be actualized by a dedicated computer that is provided so as to be configured by a processor and a memory, the processor being programmed to provide a single or a plurality of functions that are realized by a computer program. Alternatively, the control unit and the method thereof described in the present disclosure may be actualized by a dedicated computer that is provided by a processor being configured by a single or a plurality of dedicated hardware logic circuits. Alternatively, the control unit and the method thereof described in the present disclosure may be actualized by one or more dedicated computers that are configured by a combination of a processor that is programmed to provide a single or a plurality of functions, a memory, and a processor that is configured by one or more hardware logic circuits. In addition, the computer program may be stored in a non-transitory, tangible recording medium that can be read by a computer as instructions performed by the computer.

The disclosure of the present specification is not limited to the embodiments given as examples. The disclosure includes the embodiments given as examples, as well as variation examples by a person skilled in the art based on the embodiments. For example, the disclosure is not limited to the combinations of components and/or elements described according to the embodiments. The disclosure can be carried out using various combinations. The disclosure may have additional sections that can be added to the embodiments. The disclosure includes that in which a component and/or element according to an embodiment has been omitted. The disclosure includes replacements and combinations of components and/or elements between one embodiment and another embodiment. The technical scope that is disclosed is not limited to the descriptions according to the embodiments. Several technical scopes that are disclosed are cited in the scope of claims. Furthermore, the technical scopes should be understood to include all modifications within the meaning and scope of equivalency of the scope of claims.

While the present disclosure has been described with reference to embodiments thereof, it is to be understood that the disclosure is not limited to the embodiments and constructions. The present disclosure is intended to cover various modification examples and modifications within the range of equivalency. In addition, various combinations and configurations, and further, other combinations and configurations including more, less, or only a single element thereof are also within the spirit and scope of the present disclosure.

What is claimed is:

1. A battery pack comprising:

a battery;

a battery monitoring apparatus that monitors a state of the battery;

a battery control apparatus that (i) performs wireless communication with the battery monitoring apparatus, (ii) acquires battery information that is a monitoring result from the battery monitoring apparatus, and (iii) performs various types of control;

a housing that houses the battery, the battery monitoring apparatus, and the battery control apparatus;

a transmissive portion that is provided in at least a portion of the housing and allows transmission of radio waves, and a protection mechanism that is provided in the battery monitoring apparatus and the battery control apparatus and protects the battery information when wireless communication is performed, wherein:

the battery monitoring apparatus comprises a monitoring unit that monitors the state of the battery; and a monitoring-side wireless IC that transmits and receives data to and from the monitoring unit and is capable of performing wireless communication;

the battery control apparatus comprises a control unit that performs various types of control, and a control-side wireless integrated IC that transmits and receives data to and from the control unit and is capable of performing wireless communication;

the protection mechanism is provided in each of the monitoring unit and the control unit;

the battery information is protected by the protection mechanisms on a transmission side and a reception side cooperatively inspecting whether the battery information is correctly transmitted and received;

the protection mechanism of the monitoring unit generates an error detection code for detecting an error in the battery information based on the battery information when the battery information is transmitted;

the monitoring unit generates a data unit, which includes at least the error detection code and the battery information, and transmits the data unit to the monitoring-side wireless IC;

the monitoring-side wireless IC receives the data unit from the monitoring unit and wirelessly transmits the data unit;

the control-side wireless IC wirelessly receives the data unit and transmits the data unit to the control unit;

the protection mechanism of the control unit examines whether an error is present based on the error detection code in the data unit regarding the battery information in the data unit received from the control-side wireless IC; and the control unit acquires the battery information from the data unit after inspection by the protection mechanism.

2. A battery pack comprising:

a battery;

a battery monitoring apparatus monitors a state of the battery;

a battery control apparatus that performs wireless communication with the battery monitoring apparatus, acquires battery information that is a monitoring result from the battery monitoring apparatus, and performs various types of control;

a housing that houses the battery, the battery monitoring apparatus, and the battery control apparatus;

a transmissive portion that is provided in at least a portion of the housing and allows transmission of radio waves; and a protection mechanism that is provided in the battery monitoring apparatus and the battery control apparatus and protects the battery information when wireless communication is performed, wherein:

the transmissive portion is provided on any surface that configures the housing;

in a predetermined direction, the transmissive portion overlaps a transmission path for wireless communication that connects a wireless antenna of the battery monitoring apparatus and a wireless antenna of the battery control apparatus; and the predetermined direction is a thickness direction of the surface of the housing on which the transmissive portion is provided.

3. A battery pack comprising:

a battery;

a battery monitoring apparatus that monitors a state of the battery;

a battery control apparatus that performs wireless communication with the battery monitoring apparatus, acquires battery information that is a monitoring result from the battery monitoring apparatus, and performs various types of control;

a housing that houses the battery, the battery monitoring apparatus, and the battery control apparatus;

a transmissive portion that is provided in at least a portion of the housing and allows transmission of radio waves; and a protection mechanism that is provided in the battery monitoring apparatus and the battery control apparatus and protects the battery information when wireless communication is performed, wherein the transmissive portion, which is provided in the battery monitoring apparatus and the battery control apparatus, is provided so as to sandwich either of wireless antennas, provided in the battery monitoring apparatus and the battery control apparatus, in a specific direction.

4. A battery pack comprising:

a battery;

a battery monitoring apparatus that monitors a state of the battery;

a battery control apparatus that performs wireless communication with the battery monitoring apparatus, acquires battery information that is a monitoring result from the battery monitoring ap ratus, and performs various types of control;

a housing that houses the battery, the battery monitoring apparatus, and the battery control apparatus;

a transmissive portion that is provided in at least a portion of the housing and allows transmission of radio waves, and a protection mechanism that is provided in the battery monitoring apparatus and the battery control apparatus and protects the battery information when wireless communication is performed, wherein the transmissive portion is arranged at a same height as at least one of wireless antennas that are included in the battery monitoring apparatus and the battery control apparatus in a vertical direction.

5. A battery pack comprising:

a battery;

a battery monitoring apparatus that monitors a state of the battery;

a battery control apparatus that performs wireless communication with the battery monitoring apparatus, acquires battery information that is a monitoring result from the battery monitoring apparatus, and performs various types of control;

a housing that houses the battery, the battery monitoring apparatus, and the battery control apparatus;

a transmissive portion that is provided in at least a portion of the housing and allows transmission of radio waves; and a protection mechanism that is provided in the battery monitoring apparatus and the battery control apparatus and protects the battery information when wireless communication is performed, wherein a portion of the housing is formed into a thin portion of which a thickness dimension is thinner than other portions, and the thin portion corresponds to the transmissive portion.

6. A battery pack comprising:

a battery;

a battery monitoring apparatus that monitors a state of the battery;

a battery control apparatus that performs wireless communication with the battery monitoring apparatus, acquires battery information that is a monitoring result from the battery monitoring apparatus, and performs various types of control;

a housing that houses the battery, the battery monitoring apparatus, and the battery control apparatus;

a transmissive portion that is provided in at least a portion of the housing and allows transmission of radio waves; and a protection mechanism that is provided in the battery monitoring apparatus and the battery control apparatus and protects the battery information when wireless communication is performed, wherein at least a portion or an entirety of the housing is composed of resin, and the portion that is composed of resin corresponds to the transmissive portion.

7. A battery pack comprising:

a battery;

a battery monitoring apparatus that monitors a state of the battery;

a battery control apparatus that performs wireless communication with the battery monitoring apparatus, acquires battery information that is a monitoring result from the battery monitoring apparatus, and performs various types of control;

a housing that houses the battery, the battery monitoring apparatus, and the battery control apparatus;

a transmissive portion that is provided in at least a portion of the housing and allows transmission of radio waves; and a protection mechanism that is provided in the battery monitoring apparatus and the battery control apparatus and protects the battery information when wireless communication is performed, wherein:

the protection mechanism of the battery monitoring apparatus generates order information for confirming an error in an order of transmission when the battery information is transmitted, using an acquisition instruction command that instructs acquisition of battery information and transmission thereof to the battery monitoring apparatus;

the battery monitoring apparatus generates a data unit, which includes at least the order information and the battery information, and wirelessly transmits the data unit at a predetermined order that is based on a rule that is determined in advance;

the protection mechanism of the battery monitoring apparatus receives the data unit from the battery monitoring apparatus and inspects whether the data unit is received at the predetermined order based on the order information included in the data unit received from the battery monitoring apparatus; and the battery control apparatus acquires the battery information from the data unit after inspection by the protection mechanism.

8. The battery pack according to claim 7, wherein the acquisition instruction command is configured to be distinguishable even when instruction details are the same.

9. The battery pack according to claim 7, wherein:

the order information is transmitted and received following a predetermined communication schedule; and the protection mechanism of the battery monitoring apparatus inspects whether the data unit is received at the predetermined order following the predetermined communication schedule based on the order information included in the data unit received from the battery monitoring apparatus.

10. The battery pack according to claim 9, wherein the protection mechanism of the battery monitoring apparatus inspects whether the data unit is received at the predetermined order following the predetermined communication schedule based on the order information included in the data unit received from the battery monitoring apparatus, and the protection mechanism of the battery monitoring apparatus inspects whether the data unit is received within a time period prescribed based on the predetermined communication schedule.

11. The battery pack according to claim 7, wherein:

the battery monitoring apparatus comprises a monitoring unit that monitors the state of the battery, and a monitoring-side wireless IC that transmits and receives data to and from the monitoring unit and is capable of performing wireless communication.

12. The battery pack according to claim 7, wherein the protection mechanism of the battery monitoring apparatus generates the order information using, instead of the acquisition instruction command, a command that instructs an equalization process for equalizing voltages of the battery.

13. A battery pack comprising:

a battery;

a battery monitoring apparatus that monitors a state of the battery;

a battery control apparatus that performs wireless communication with the battery monitoring apparatus, acquires battery information that is a monitoring result from the battery monitoring apparatus, and performs various types of control;

a housing that houses the battery, the battery monitoring apparatus, and the battery control apparatus;

a transmissive portion that is provided in at least a portion of the housing and allows transmission of radio waves; and a protection mechanism that is provided in the battery monitoring apparatus and the battery control apparatus and protects the battery information when wireless communication is performed, wherein:

the protection mechanism of the battery monitoring apparatus generates order information for confirming an error in an order of transmission when the battery information is transmitted;

the battery monitoring apparatus generates a data unit, which includes at least the order information and the battery information, and wirelessly transmits the data unit at a predetermined order that is based on a rule that is determined in advance;

the protection mechanism of the battery monitoring apparatus receives the data unit from the battery monitoring apparatus and inspects whether the data unit is received at the predetermined order based on the order information included in the data unit received from the battery monitoring apparatus;

the battery control apparatus acquires the battery information from the data unit after inspection by the protection mechanism;

the battery monitoring apparatus comprises a monitoring unit that monitors the state of the battery, and a monitoring-side wireless IC that transmits and receives data to and from the monitoring unit and is capable of performing wireless communication;

the battery control apparatus comprises a control unit that performs various types of control, and a control-side wireless integrated IC that transmits and receives data to and from the control unit and is capable of performing wireless communication;

the protection mechanism is provided in each of the monitoring unit and the control unit;

the battery information is protected by the protection mechanisms on a transmission side and a reception side cooperatively inspecting whether the battery information is correctly transmitted and received;

the monitoring-side wireless IC generates wireless data by adding communication control information required for wireless communication and communication protection data for inspecting and protecting the communication control information to the data unit that is received from the control unit, and wirelessly transmits the wireless data; and the control-side wireless IC, when the wireless data is received, inspects the communication control information in the wireless data based on the communication protection data in the wireless data, and subsequently acquires the data unit in the wireless data and transmits the data unit to the control unit.

14. A battery pack comprising:

a battery;

a battery monitoring apparatus that monitors a state of the battery;

a battery control apparatus that performs wireless communication with the battery monitoring apparatus, acquires battery information that is a monitoring result from the battery monitoring apparatus, and performs various types of control; and a housing that houses the battery, the battery monitoring apparatus, and the battery control apparatus, wherein:

a transmissive portion that is provided in at least a portion of the housing and allows transmission of radio waves;

the battery monitoring apparatus comprises a monitoring unit that monitors the state of the battery, and a monitoring-side wireless IC that transmits and receives data to and from the monitoring unit and is capable of performing wireless communication;

the battery control apparatus comprises a control unit that performs various types of control, and a control-side wireless integrated IC that transmits and receives data to and from the control unit and is capable of performing wireless communication;

a protection mechanism is provided in each of the monitoring unit of the battery monitoring apparatus and the control unit of the battery control apparatus and protects the battery information when wireless communication is performed;

the protection mechanism of the monitoring unit generates, when the battery information is transmitted, a data unit, which includes the battery information and inspection data of the battery information, and transmits the data unit to the monitoring-side wireless IC;

the monitoring-side wireless IC generates wireless data by adding communication control information required for wireless communication and communication protection data for inspecting and protecting the communication control information to the data unit that is received from the control unit, and wirelessly transmits the wireless data;

the control-side wireless IC, when the wireless data is received, inspects the communication control information in the wireless data based on the communication protection data in the wireless data, and subsequently acquires the data unit in the wireless data and transmits the data unit to the control unit;

the protection mechanism of the control unit inspects the battery information based on the inspection data of the data unit received from the control-side wireless IC; and the control unit acquires the battery information from the data unit after inspection by the protection mechanism.

15. The battery pack according to claim 14, wherein:

the protection mechanism of the monitoring unit generates order information that indicates a transmission timing that is based on a rule that is determined in advance when the battery information is transmitted;

the monitoring unit generates a data unit, which includes at least the order information and the battery information, and transmits the data unit to the monitoring-side wireless IC at a predetermined transmission timing that is based on a rule that is determined in advance;

the monitoring-side wireless IC receives the data unit from the monitoring unit and wirelessly transmits the data unit;

the control-side wireless IC wirelessly receives the data unit and transmits the data unit to the control unit;

the protection mechanism of the control unit inspects whether the data unit is received at a predetermined reception timing based on the order information included in the data unit received from the control-side wireless IC; and the control unit acquires the battery information from the data unit after inspection by the protection mechanism.

16. The battery pack according to claim 14, wherein:

the protection mechanism of the monitoring unit generates an error detection code for detecting an error in the battery information based on the battery information when the battery information is transmitted;

the monitoring unit generates a data unit, which includes at least the error detection code and the battery information, and transmits the data unit to the monitoring-side wireless IC;

the monitoring-side wireless IC receives the data unit from the monitoring unit and wirelessly transmits the data unit;

the control-side wireless IC wirelessly receives the data unit and transmits the data unit to the control unit;

the protection mechanism of the control unit examines whether an error is present based on the error detection code in the data unit regarding the battery information in the data unit received from the control-side wireless IC; and the control unit acquires the battery information from the data unit after inspection by the protection mechanism.

17. The battery pack according to claim 14, wherein:

the protection mechanism of the monitoring unit acquires identification information that indicates a transmission source when the battery information is transmitted;

the monitoring unit generates a data unit, which includes at least the identification information and the battery information, and transmits the data unit to the monitoring-side wireless IC;

the monitoring-side wireless IC receives the data unit from the monitoring unit and wirelessly transmits the data unit;

the control-side wireless IC wirelessly receives the data unit and transmits the data unit to the control unit;

the protection mechanism of the control unit performs inspection of the transmission source based on the identification information that is included in the data unit received from the control-side wireless IC; and the control unit acquires the battery information from the data unit after inspection by the protection mechanism.

18. The battery pack according to claim 14, wherein the monitoring-side wireless IC comprises a plurality of monitoring-side wireless ICs configured to respectively acquire the battery information from a plurality of monitoring units and collectively wirelessly transmit the sets of battery information.

19. The battery pack according to claim 14, wherein the battery information includes at least one of temperature information, voltage information, and self-diagnosis information of the battery.

20. The battery pack according to claim 14, wherein:

the transmissive portion is provided on any surface that configures the housing; and in a predetermined direction, the transmissive portion overlaps a transmission path for wireless communication that connects a wireless antenna of the battery monitoring apparatus and a wireless antenna of the battery control apparatus.

21. The battery pack according to claim 14, wherein:

the battery monitoring apparatus comprises a plurality of battery monitoring apparatuses;

the transmissive portion is provided on any surface that configures the housing; and in a predetermined direction, the transmissive portion overlaps a transmission path for wireless communication that connects a wireless antenna of any of the plurality of battery monitoring apparatuses and a wireless antenna of the battery control apparatus, and the protection mechanism is provided in at least the battery monitoring apparatus.

22. The battery pack according to claim 14, wherein:

either of wireless antennas, provided in the battery monitoring apparatus and the battery control apparatus, is arranged within a range of projection dimensions of the transmissive portion in a predetermined direction, or a transmission path for wireless communication that connects the wireless antenna of the battery monitoring apparatus and the wireless antenna of the battery control apparatus passes through the range of projection dimensions.

23. The battery pack according to claim 20, wherein the predetermined direction is a thickness direction of the surface of the housing on which the transmissive portion is provided.

24. The battery pack according to claim 14, wherein:

the battery pack is mounted to a vehicle;

the transmissive portion is provided on a surface of the housing other than an installation surface that is set in the vehicle; and either of wireless antennas, provided in the battery monitoring apparatus and the battery control apparatus, opposes the surface on which the transmissive portion is provided, and the protection mechanism is provided in the battery monitoring apparatus and the battery control apparatus that comprises at least the wireless antenna.

25. The battery pack according to claim 14, wherein wireless antennas, provided in the battery monitoring apparatus and the battery control apparatus, are arranged in an opposing manner inside the housing so as to be capable of transmitting and receiving direct waves.

26. The battery pack according to claim 14, wherein the transmissive portion, provided in the battery monitoring apparatus and the battery control apparatus, is provided so as to sandwich either of wireless antennas, provided in the battery monitoring apparatus and the battery control apparatus, in a specific direction.

27. The battery pack according to claim 14, wherein the transmissive portion is provided in an overall area of a transmission path for wireless communication that connects a wireless antenna of the battery monitoring apparatus and a wireless antenna of the battery control apparatus.

28. The battery pack according to claim 14, wherein when viewed from a specific direction, the transmissive portion is provided so as to surround wireless antennas that are included in the battery monitoring apparatus and the battery control apparatus.

29. The battery pack according to claim 14, wherein the transmissive portion is arranged at a same height as at least one of wireless antennas that are included in the battery monitoring apparatus and the battery control apparatus in a vertical direction.

30. The battery pack according to claim 14, wherein:

a plurality of batteries are arrayed so as to form a plurality of rows along an array direction that is determined in advance; and wireless antennas that are included in the battery monitoring apparatus and the battery control apparatus are arranged along the array direction between the plurality of batteries that are arrayed.

31. The battery pack according to claim 30, wherein the wireless antennas and the transmissive portion are arranged in an array along the array direction.

32. The battery pack according to claim 14, wherein the transmissive portion, the battery monitoring apparatus, and the battery control apparatus are arranged on an upper side in a vertical direction of the housing.

33. The battery pack according to claim 14, wherein either of the battery monitoring apparatus and the battery control apparatus is provided further towards a housing side than is the battery.

34. The battery pack according to claim 14, wherein either of the battery monitoring apparatus and the battery control apparatus is arranged along the transmissive portion.

35. The battery pack according to claim 14, wherein:

the battery is a laminated-type cell; and the battery pack is arranged under a vehicle seat in a vertical direction.

36. The battery pack according to claim 14, wherein the transmissive portion is an explosion-proof valve that releases gas inside the housing, a service plug that disconnects electrical connection between outside and the battery, or a seal member that seals a gap in the housing.

37. The battery pack according to claim 14, wherein a portion of the housing is formed into a thin portion of which a thickness dimension is thinner than other portions, and the thin portion corresponds to the transmissive portion.

38. The battery pack according to claim 14, wherein at least a portion or an entirety of the housing is composed of resin, and the portion that is composed of resin corresponds to the transmissive portion.

39. A communication method performed by a battery control apparatus of a battery pack, the battery pack comprising:

a battery;

a battery monitoring apparatus that monitors a state of the battery;

the battery control apparatus that performs wireless communication with the battery monitoring apparatus, acquires battery information that is a monitoring result from the battery monitoring apparatus, and performs various types of control; and a housing that houses the battery, the battery monitoring apparatus, and the battery control apparatus, the communication method comprising:

providing a transmissive portion in at least a portion of the housing, the transmissive portion allowing transmission of radio waves;

adding, to the battery information that is wirelessly transmitted when wireless transmission is performed, inspection data for inspecting the battery information by the battery monitoring apparatus;

inspecting, by the battery control apparatus, whether the battery information is correctly transmitted and received based on the inspection data that is added to the battery information, when the battery information is received from the battery monitoring apparatus;

providing, in the battery monitoring apparatus, a monitoring unit that monitors the state of the battery, and a monitoring-side wireless IC that transmits and receives data to and from the monitoring unit and is capable of performing wireless communication;

providing, in the battery control apparatus, a control unit, which performs various types of control, and a control-side wireless integrated IC that transmits and receives data to and from the control unit and is capable of performing wireless communication;

providing a protection mechanism in each of the monitoring unit of the battery monitoring apparatus and the control unit of the battery control apparatus that protects the battery information when wireless communication is performed;

when the battery information is transmitted, generating, by the protection mechanism of the monitoring unit, a data unit, which includes the battery information and the inspection data of the battery information, and transmitting the data unit to the monitoring-side wireless IC;

generating, by the monitoring-side wireless IC, wireless data by adding communication control information required for wireless communication and communication protection data for inspecting and protecting the communication control information to the data unit that is received from the control unit, and wirelessly transmitting the wireless data;

when the wireless data is received, inspecting, by the control-side wireless IC, the communication control information in the wireless data based on the communication protection data in the wireless data, and subsequently acquiring the data unit in the wireless data and transmitting the data unit to the control unit;

inspecting, by the protection mechanism of the control unit, the battery information based on the inspection data of the data unit received from the control-side wireless IC; and acquiring, by the control unit, the battery information from the data unit after inspection by the protection mechanism.

* * * * *